(12) United States Patent
Chang et al.

(10) Patent No.: US 10,714,581 B2
(45) Date of Patent: *Jul. 14, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 323 days.

This patent is subject to a terminal disclaimer.

(21) Appl. No.: 15/901,343

(22) Filed: Feb. 21, 2018

(65) Prior Publication Data

US 2018/0182857 A1  Jun. 28, 2018

Related U.S. Application Data

(63) Continuation of application No. 14/749,602, filed on Jun. 24, 2015, now Pat. No. 9,929,242, which is a
(Continued)

(51) Int. Cl.
*H01L 29/423* (2006.01)
*H01L 29/78* (2006.01)
(Continued)

(52) U.S. Cl.
CPC .. *H01L 29/42376* (2013.01); *H01L 21/31111* (2013.01); *H01L 21/823821* (2013.01);
(Continued)

(58) Field of Classification Search
CPC ......... H01L 29/41791; H01L 29/42376; H01L 29/66545; H01L 29/66795; H01L 29/7831;
(Continued)

(56) References Cited

U.S. PATENT DOCUMENTS 8,120,073 B2  2/2012  Rakshit et al.
8,487,378 B2  7/2013  Goto et al.
(Continued)

FOREIGN PATENT DOCUMENTS

CN   1577850 A   2/2005
DE   112005000704 T5   9/2007
(Continued)

OTHER PUBLICATIONS

Notice of Allowance U.S. Appl. No. 14/621,805 dated Jul. 18, 2016.
(Continued)

*Primary Examiner* — Mohsen Ahmadi
(74) *Attorney, Agent, or Firm* — McDermott Will & Emery LLP

(57) ABSTRACT

A Fin FET semiconductor device includes a fin structure extending in a first direction and extending from an isolation insulating layer. The Fin FET device also includes a gate stack including a gate electrode layer, a gate dielectric layer, side wall insulating layers disposed at both sides of the gate electrode layer, and interlayer dielectric layers disposed at both sides of the side wall insulating layers. The gate stack is disposed over the isolation insulating layer, covers a portion of the fin structure, and extends in a second direction perpendicular to the first direction. A recess is formed in an upper surface of the isolation insulating layer not covered by the side wall insulating layers and the interlayer dielectric layers. At least part of the gate electrode layer and the gate dielectric layer fill the recess.

17 Claims, 17 Drawing Sheets

Related U.S. Application Data continuation-in-part of application No. 14/621,805, filed on Feb. 13, 2015, now Pat. No. 9,502,567.

(60) Provisional application No. 62/102,557, filed on Jan. 12, 2015.

(51) Int. Cl.
| | |
|---|---|
| *H01L 29/66* | (2006.01) |
| *H01L 29/06* | (2006.01) |
| *H01L 27/12* | (2006.01) |
| *H01L 27/092* | (2006.01) |
| *H01L 27/088* | (2006.01) |
| *H01L 21/84* | (2006.01) |
| *H01L 21/8238* | (2006.01) |
| *H01L 21/311* | (2006.01) |
| *H01L 29/417* | (2006.01) |
| *H01L 27/108* | (2006.01) |

(52) U.S. Cl.
CPC ........ *H01L 21/845* (2013.01); *H01L 27/0886* (2013.01); *H01L 27/0924* (2013.01); *H01L 27/1211* (2013.01); *H01L 29/0653* (2013.01); *H01L 29/6653* (2013.01); *H01L 29/66545* (2013.01); *H01L 29/66795* (2013.01); *H01L 29/785* (2013.01); *H01L 29/7851* (2013.01); H01L 21/823842 (2013.01); H01L 27/10879 (2013.01); H01L 29/41791 (2013.01); H01L 29/7831 (2013.01)

(58) Field of Classification Search
CPC ............. H01L 29/7851; H01L 29/7856; H01L 29/786; H01L 27/0886; H01L 27/0924; H01L 27/10826; H01L 27/10879; H01L 27/1211; H01L 21/82831; H01L 21/845
See application file for complete search history.

(56) References Cited

U.S. PATENT DOCUMENTS

| | | | |
|---|---|---|---|
| 8,729,634 B2 | 5/2014 | Shen et al. | |
| 8,826,213 B1 | 9/2014 | Ho et al. | |
| 8,887,106 B2 | 11/2014 | Ho et al. | |
| 8,900,951 B1 | 12/2014 | Cheng et al. | |
| 9,105,744 B2* | 8/2015 | Lee ................. | H01L 21/823431 |
| 2005/0224800 A1 | 10/2005 | Lindert et al. | |
| 2006/0071275 A1 | 4/2006 | Brask et al. | |
| 2006/0172497 A1 | 8/2006 | Hareland et al. | |
| 2007/0158700 A1* | 7/2007 | Koh ................. | H01L 29/66795 257/288 |
| 2009/0061572 A1 | 3/2009 | Hareland et al. | |
| 2010/0163970 A1 | 7/2010 | Rakshit et al. | |
| 2010/0163976 A1 | 7/2010 | Lee et al. | |
| 2010/0164051 A1 | 7/2010 | Chae et al. | |
| 2012/0313170 A1 | 12/2012 | Chang et al. | |
| 2013/0082304 A1 | 4/2013 | Liu et al. | |
| 2013/0224945 A1 | 8/2013 | Liu et al. | |
| 2013/0277686 A1 | 10/2013 | Liu et al. | |
| 2013/0285141 A1 | 10/2013 | Kuo et al. | |
| 2013/0309839 A1 | 11/2013 | Wilson et al. | |
| 2014/0061792 A1 | 3/2014 | Bu et al. | |
| 2014/0070285 A1 | 3/2014 | Xie et al. | |
| 2014/0070328 A1 | 3/2014 | Goto et al. | |
| 2014/0103414 A1* | 4/2014 | Koldiaev ............. | H01L 21/845 257/296 |
| 2014/0145242 A1 | 5/2014 | Huang et al. | |
| 2014/0203370 A1 | 7/2014 | Maeda et al. | |
| 2014/0206156 A1 | 7/2014 | Liu et al. | |
| 2014/0248751 A1* | 9/2014 | Cheng ............. | H01L 21/823807 438/285 |
| 2014/0282326 A1 | 9/2014 | Chen et al. | |
| 2014/0319623 A1 | 10/2014 | Tsai et al. | |
| 2015/0021697 A1 | 1/2015 | Colinge et al. | |
| 2015/0060960 A1 | 3/2015 | Xie et al. | |
| 2015/0084041 A1 | 3/2015 | Hur et al. | |
| 2015/0115334 A1* | 4/2015 | Liaw ................. | H01L 21/845 257/288 |
| 2015/0129934 A1* | 5/2015 | Xie ................. | H01L 27/0886 257/192 |
| 2015/0214370 A1 | 7/2015 | Kim et al. | |
| 2015/0311335 A1* | 10/2015 | Ching ................. | H01L 29/785 257/192 |
| 2016/0027781 A1 | 1/2016 | Glass et al. | |
| 2016/0133632 A1 | 5/2016 | Park et al. | |
| 2016/0204260 A1* | 7/2016 | Ching ................. | H01L 29/7851 257/401 |

FOREIGN PATENT DOCUMENTS

| | | |
|---|---|---|
| DE | 102014100397 A1 | 7/2014 |
| DE | 102013108385 B3 | 1/2015 |
| KR | 10-2012-0096436 A | 8/2012 |
| KR | 10-2014-0127725 A | 11/2014 |
| TW | 201113984 A | 4/2011 |

OTHER PUBLICATIONS

Office Action Taiwan Patent Application No. 10-2015-0071057 dated Jun. 14, 2016 with full English translation.
Office Action Korean Patent Application No. 10-2015-0142098 dated Sep. 2, 2016 with English translation.
Office Action Taiwanese Patent Application No. 104139353 dated Dec. 30, 2016.
Notice of Allowance issued in U.S. Appl. No. 14/749,602, dated Nov. 16, 2017.
Non-Final Office Action issued in U.S. Appl. No. 14/749,602, dated Dec. 14, 2015.
Final Office Action issued in U.S. Appl. No. 14/749,602, dated Jun. 22, 2016.
Non-Final Office Action issued in U.S. Appl. No. 14/749,602, dated Feb. 10, 2017.
Final Office Action issued in U.S. Appl. No. 14/749,602, dated Jul. 27, 2017.

* cited by examiner

SEMICONDUCTOR DEVICE AND MANUFACTURING METHOD THEREOF

RELATED APPLICATIONS

This application is a continuation of U.S. patent application Ser. No. 14/749,602, filed Jun. 24, 2015, which claims the priority of U.S. Provisional Application No. 62/102,557 filed on Jan. 12, 2015, and is a continuation-in-part of U.S. application Ser. No. 14/621,805 filed on Feb. 13, 2015, the entire contents of which applications are incorporated herein by reference.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-5E show exemplary perspective views of the enclosed portion of FIG. 4C, according to some embodiments of the present disclosure;

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Embodiments of semiconductor structures and methods for forming the same are provided. The semiconductor structure may include a gate structure formed by a "gate-last" process. That is, a dummy gate structure is formed first and is replaced by the gate structure afterwards. After the dummy gate structure is removed, a portion of an isolation insulating layer is also removed, such that the gate structure formed afterwards can extend into the isolation insulating layer and the performance of the structure can be improved.

Figure 1A:
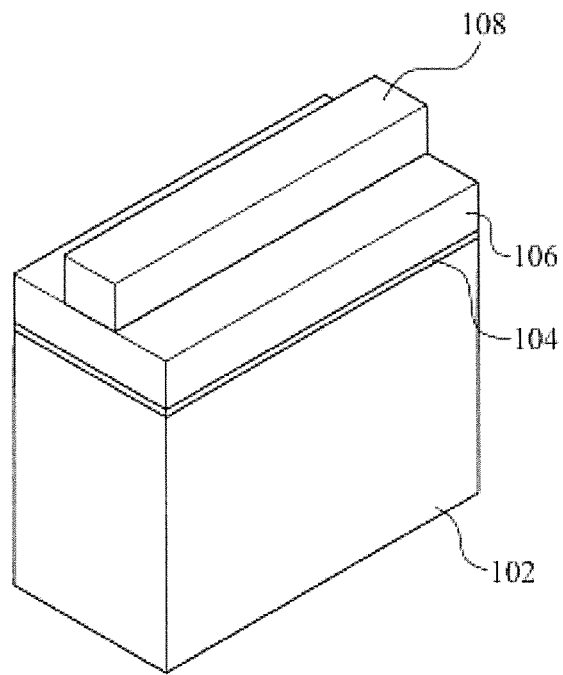
FIGS. 1A to 1J are cross-sectional representations of various stages of forming a semiconductor structure in accordance with some embodiments of the present disclosure.

FIGS. 1A to 1J are cross-sectional representations of various stages of forming a semiconductor structure 100 in accordance with some embodiments. As shown in FIG. 1A, a substrate 102 is provided in accordance with some embodiments. Substrate 102 may be a semiconductor wafer such as a silicon wafer. Alternatively, the substrate 102 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 102 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 102. The substrate 102 may include various regions that have been suitably doped with impurities (e.g., p-type or n-type conductivity).

In FIGS. 1A-3B, a Fin FET device may include one gate structure disposed over one fin structure, thereby forming an isolated Fin FET. It is noted that the term "isolated" means that a distance to another Fin FET is more than 5× (a width of the channel layer of the fin structure) in one of the X and Y directions. In some embodiments, the isolated Fin FET may include plural gate electrodes for one fin structure or one gate electrode for plural fin structures.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
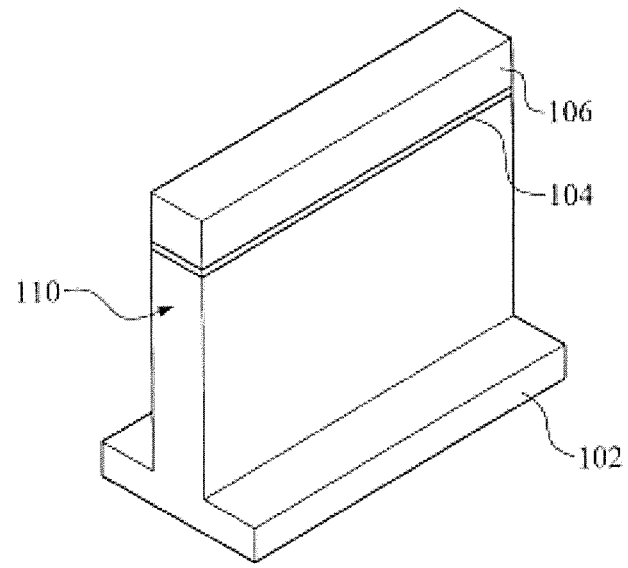

Next, a fin structure 110 is formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

Figure 1C:
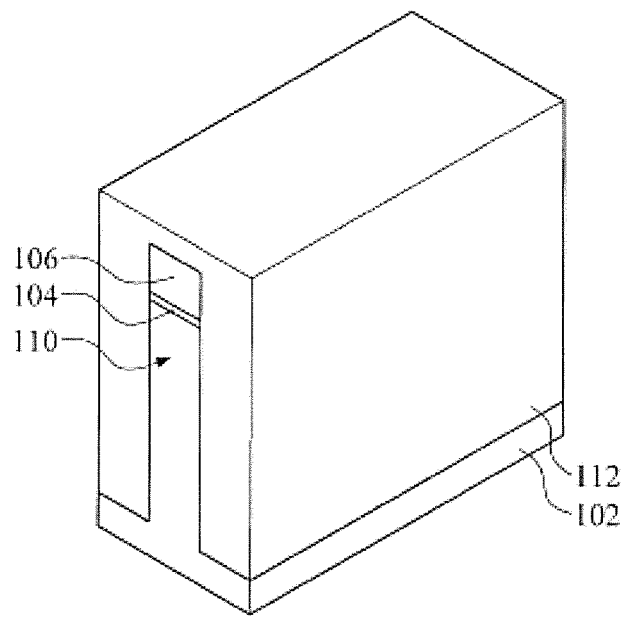

After fin structure 110 is formed, an insulating layer 112 is formed to cover fin structures 110 over substrate 102, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Figure 1D:
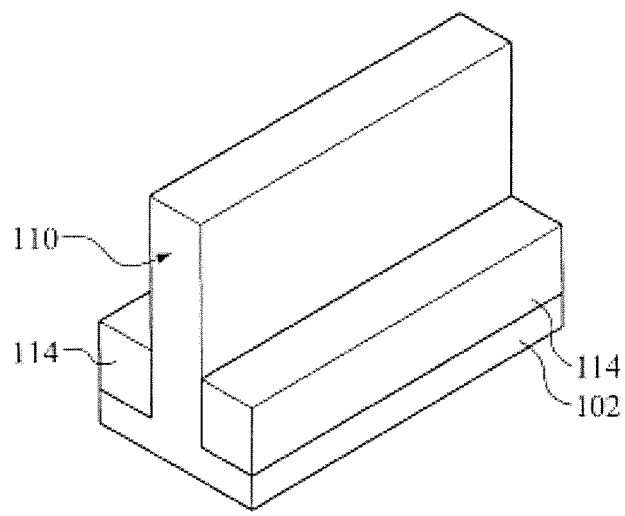

Next, insulating layer 112 is recessed to form an isolation insulating layer 114, such as a shallow trench isolation insulating layer, around fin structure 110, as shown in FIG. 1D in accordance with some embodiments. Insulating layer 112 may be recessed by a wet etching process or a dry etching process. In addition, mask layer 106 and dielectric layer 104 are removed.

Figure 1E:
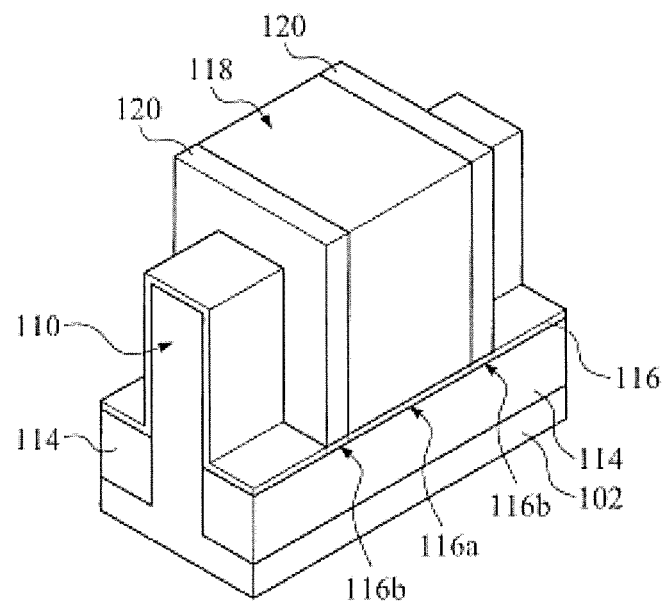

Afterwards, a dielectric layer 116 is formed to cover fin structure 110 and isolation insulating layer 114, and a dummy gate structure 118 is formed over fin structure 110, as shown in FIG. 1E in accordance with some embodiments.

In some embodiments, dielectric layer 116 is made of silicon nitride, silicon oxide, silicon oxynitride, or other applicable dielectric materials. Dielectric layer 116 may be formed by chemical vapor deposition (CVD), physical vapor deposition, (PVD), atomic layer deposition (ALD), spin-on coating, or other applicable processes. A thickness of the dielectric layer 116 is in a range of about 1 nm to 5 nm.

Dummy gate structure 118 is formed across fin structure 110 and extends over isolation insulating layer 114. In some embodiments, dummy gate structure 118 is made of polysilicon. A thickness of the polysilicon layer is in a range of about 5 to about 100 nm in some embodiments.

After dummy gate structure 118 is formed, spacers 120 are formed on the both sidewalls of dummy gate structure 118 in accordance with some embodiments. As shown in FIG. 1E, dummy gate structure 118 is formed on a first portion 116a of dielectric layer 116, and spacers are formed on second portions 116b of dielectric layer 116.

Since spacers 120 are formed on the sidewalls of dummy gate structure 118, each spacer 120 has a first height $H_1$ substantially equal to the height of dummy gate structure 118.

In some embodiments, spacers 120 are made of one or more layers of silicon nitride, silicon oxide, silicon oxynitride, silicon carbide, or other applicable dielectric materials. Spacers 120 may include a single layer or multiple layers.

Figure 1F:
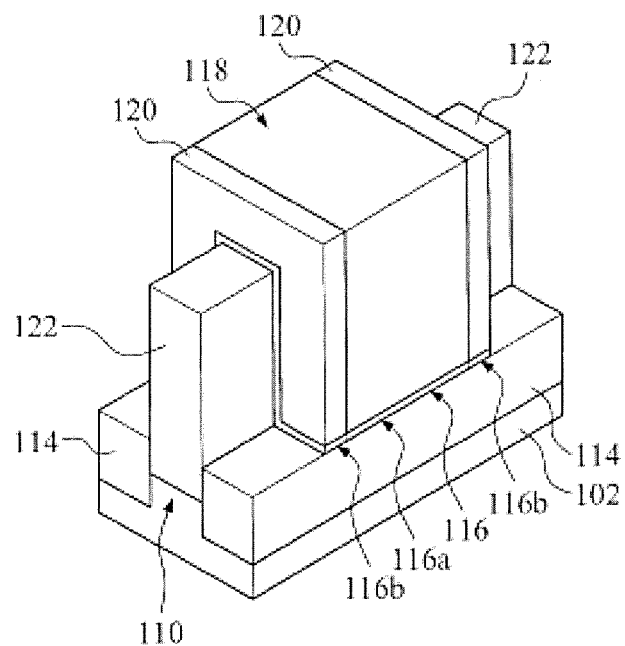

Next, source/drain structures 122 are formed in fin structure 110, as shown in FIG. 1F in accordance with some embodiments. More specifically, the portions of dielectric layer 116 not covered by dummy gate structure 118 and spacers 120 are removed. As shown in FIG. 1F, first portion 116a of dielectric layer 116 below dummy gate structure 118 and second portion 116b of dielectric layer 118 are not removed in this step. After the exposed dielectric layer 116 is removed, the portions of fin structure 110 adjacent to dummy gate structure 118 are recessed to form recesses at two sides of fin structure 110. Next, a strained material is grown in the recesses by an epitaxial (epi) process. In addition, the lattice constant of the strained material may be different from the lattice constant of substrate 102. In some embodiments, source/drain structures 122 include one or more layers of Ge, SiGe, InAs, InGaAs, InSb, GaAs, GaSb, InAlP, InP, or the like.

Figure 1G:
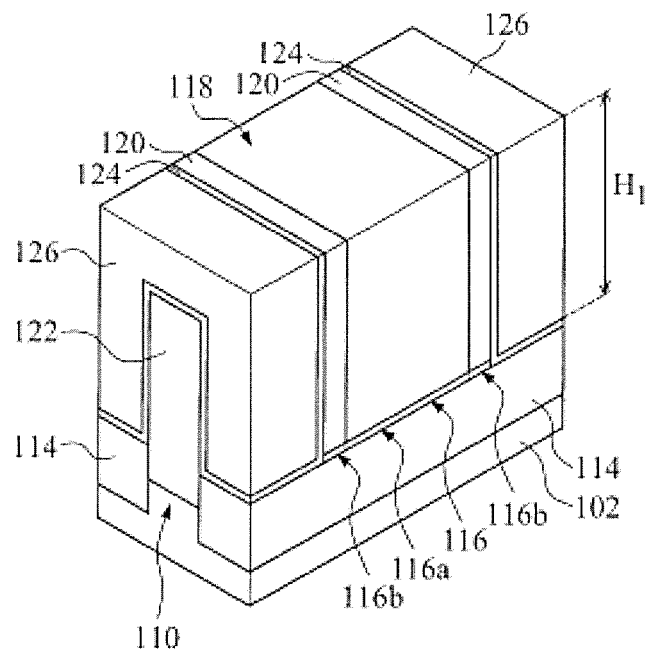

After source/drain structures 122 are formed, a contact etch stop layer (CESL) 124 is formed over substrate 102, and an inter-layer dielectric (ILD) layer 126 is formed on contact etch stop layer 124, as shown in FIG. 1G in accordance with some embodiments. In some embodiments, contact etch stop layer 124 is made of one or more layers of silicon nitride, silicon oxynitride, and/or other applicable materials. Contact etch stop layer 124 may be formed by plasma enhanced CVD, low pressure CVD, ALD, or other applicable processes.

Inter-layer dielectric layer 126 may include multilayers made of one or multiple layers of dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 126 may be formed by chemical vapor deposition (CVD), physical vapor deposition, (PVD), atomic layer deposition (ALD), spin-on coating, or other applicable processes.

Next, a polishing process is performed on inter-layer dielectric layer 126 and contact etch stop layer 124 to expose the top surface of dummy gate structure 118 in accordance with some embodiments. In some embodiments, a chemical mechanical polishing (CMP) process is performed until the top surface of dummy gate structure 118 is exposed.

Figure 1H:
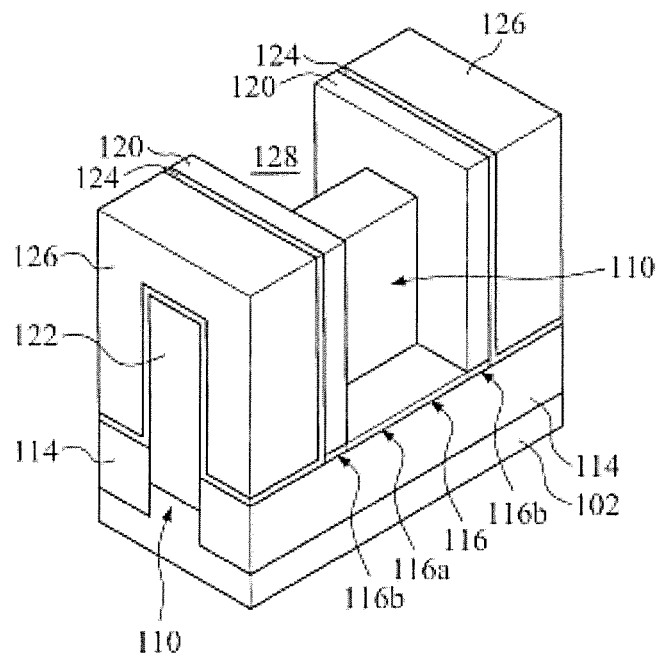

After the polishing process is performed, dummy gate structure 118 is removed, such that a trench 128 is formed, as shown in FIG. 1H in accordance with some embodiments. In some embodiments, dummy gate structure 118 is removed by performing a dry etching process. In some embodiments, dummy gate structure 118 is removed by performing a dry etching process and a wet etching process.

As shown in FIG. 1H, the bottom surface of each spacer 120 is substantially level with the bottom surface of trench 128. By removing the dummy gate structure 118, the channel layer of the fin structure 110 is exposed. In some embodiments, after dummy gate structure 118 is removed, additional side wall insulating layers may be formed on the spacer 120 inside the trench 128.

Figure 1I:
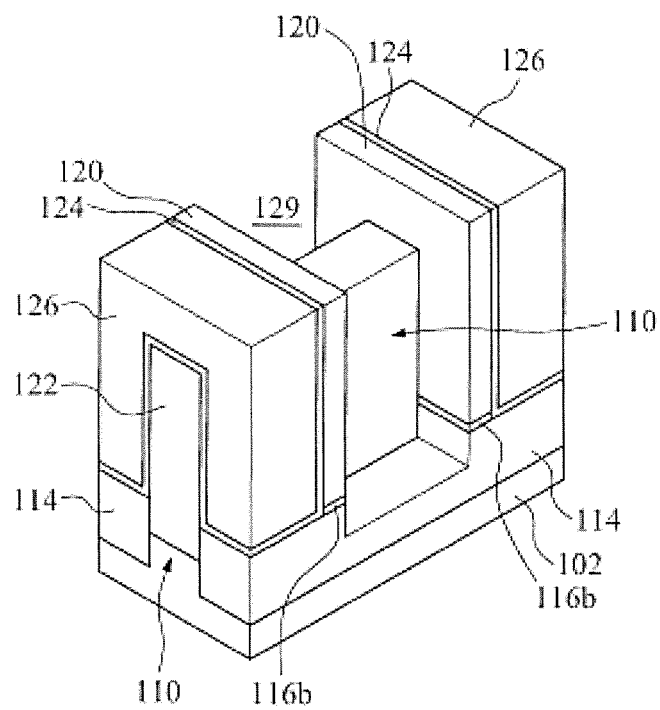

After dummy gate structure 118 is removed, first portion 116a of dielectric layer 116 exposed by trench 128 and an upper portion of isolation insulating layer 114 below first portion 116a of dielectric layer 116 are removed, as shown in FIG. 1I in accordance with some embodiments. In some embodiments, first portion 116a of dielectric layer 116 is removed by a first etching process and the upper portion of isolation insulating layer 114 is removed by a second etching process. In some embodiments, first portion 116a of dielectric layer 116 and the upper portion of isolation insulating layer 114 are removed by the same etching process.

As shown in FIG. 1I, since the portion of the upper portion of isolation insulating layer 114 is removed, trench 128 is further extended into isolation insulating layer 114 to form an extended trench 129, such that the bottom surface of each spacer 120 is not level with (e.g. is higher than) the bottom surface of extended trench 129. In some embodiments, side walls of the portion of the extended trench 129 below the dielectric layer 116 may have a flat profile as shown in FIG. 1I. In other embodiments, the side walls may have a curved profile as later shown in FIGS. 5C-5E.

Figure 1J:
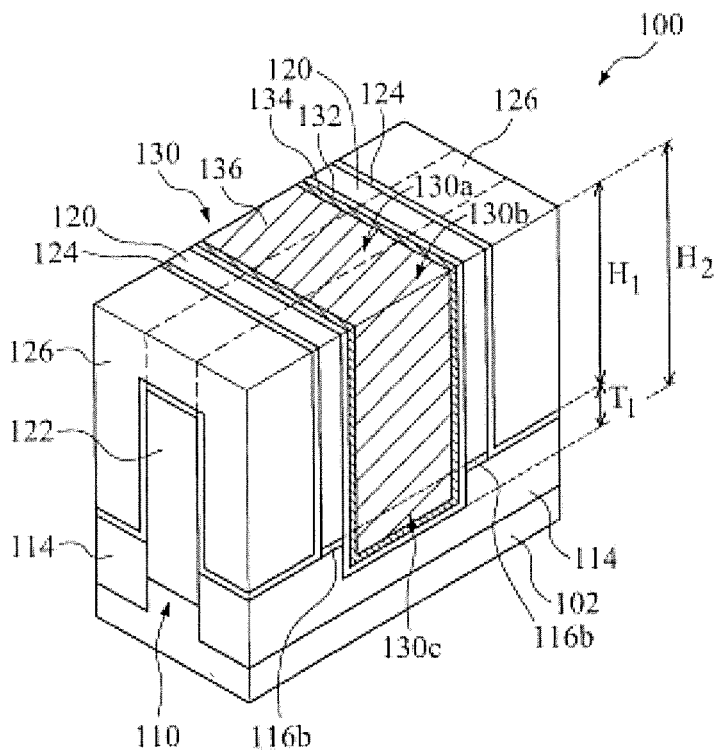

After the upper portion of isolation insulating layer 114 is removed to form extended trench 129, a metal gate structure 130 is formed in extended trench 129, as shown in FIG. 1J in accordance with some embodiments. In some embodiments, metal gate structure 130 includes a gate dielectric layer 132, a work function metal layer 134, and a metal gate electrode layer 136.

In some embodiments, gate dielectric layer 132 is made of one or more layers of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 134 is formed over gate dielectric layer 132 in accordance with some embodiments. Work function metal layer 134 is customized to have the proper work function. For example, if a P-type work function metal (P-metal) for a PMOS device is desired, one or more layers of TiN, WN, or W may be used. On the other hand, if an N-type work function metal (N-metal) for NMOS devices is desired, one or more layers of TiAl, TiAlN, or TaCN, may be used.

Metal gate electrode layer 136 is formed over work function metal layer 134 in accordance with some embodiments. In some embodiments, metal gate electrode layer 136 is made of one or more layers of conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 132, work function metal layer 134, and metal gate electrode layer 136 may be formed by any applicable process to any applicable thickness.

It should be noted that additional layers may be formed above and/or below gate dielectric layer 132, work function metal layer 134, and metal gate electrode layer 136, such as liner layers, interface layers, seed layers, adhesion layers, barrier layers, or the like. In addition, gate dielectric layer 132, work function metal layer 134, and metal gate electrode layer 136 may include more than one layer made of various materials.

As shown in FIG. 1J, metal gate structure 130 is formed across fin structure 110 and extends over isolation insulating layer 114. More specifically, metal gate structure 130 includes a first portion 130a formed over fin structure 110 and a second portion 130b formed over isolation insulating layer 114. Since the upper portion of isolation insulating layer 114 is removed so that extended trench 129 can be extended into isolation insulating layer 114, second portion 130b of metal gate structure 130 formed over extended trench 129 is also extended into isolation insulating layer 114. Accordingly, second portion 130a of metal gate structure 130 has a second height $H_2$ which is greater than the first height $H_1$ of spacer 120.

More specifically, second portion 130b includes an extending portion 130c extending into isolation insulating layer 114. The formation of extending portion 130c can enlarge the effective area of metal gate structure 130 and/or may be used to adjust the electrical properties of semiconductor structure 100. As shown in FIG. 1J, extending portion 130c has a thickness $T_1$, which may also be defined as the difference between the first height $H_1$ and the second height $H_2$. In some embodiments, the thickness $T_1$ of extending portion 130c is in a range from about 1 nm to about 200 nm. Although the formation of extending portion 130c can enlarge the effective area of the structure, if extending portion 130c is too thick, the risk of leakage may also increase.

The thickness $T_1$ of extending portion 130c may be adjusted by changing the etching time for etching isolation insulating layer 114. In some embodiments, the thickness $T_1$ of extending portion 130c is in a range from about 3 nm to about 30 nm. In some embodiments, the thickness $T_1$ of extending portion 130c is in a range from about 3 nm to about 80 nm. In some embodiments, the thickness $T_1$ of extending portion 130c is in a range from about 80 nm to about 120 nm. In some embodiments, the thickness $T_1$ of extending portion 130c is in a range from about 120 nm to about 150 nm. In some embodiments, the thickness $T_1$ of extending portion 130c is in a range from about 150 nm to about 200 nm. Extending portion 130c with a different thickness may have different electrical properties, and therefore the thickness $T_1$ of extending portion 130c may be adjusted according to its applications. In some embodiments, the bottom surface of the gate structure 130 is substantially level with or lower than the bottom surface of the fin structure 110. Alternatively, the bottom surface of the gate structure 130 is higher than the bottom surface of the fin structure 110.

Figure 2A:
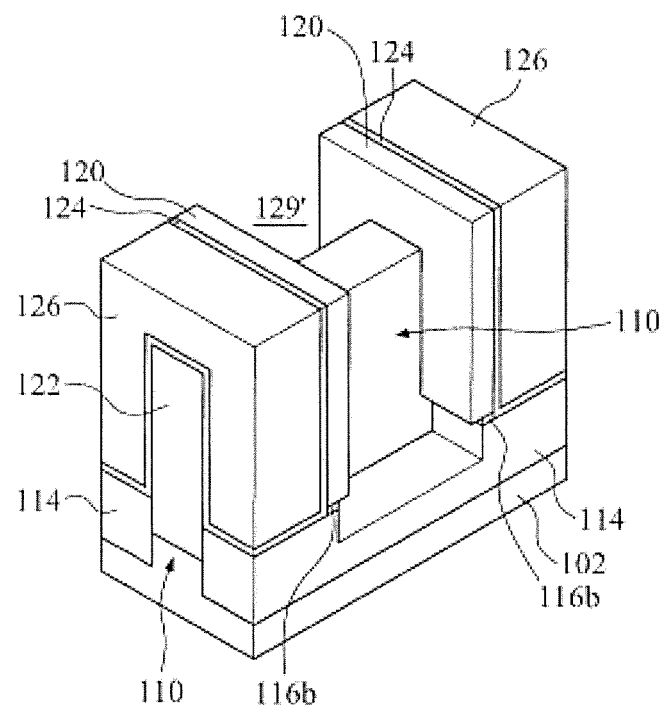
FIGS. 2A to 2B are cross-sectional representations of a semiconductor structure in accordance with some embodiments of the present disclosure.
Figure 2B:
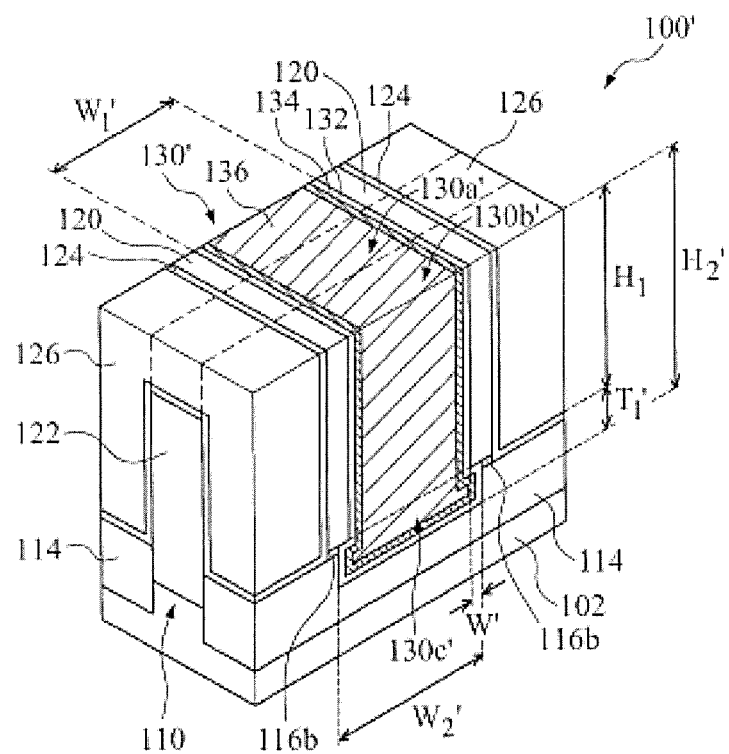

FIGS. 2A to 2B are cross-sectional representations of various stages of forming a semiconductor structure 100' in accordance with some embodiments. Methods and materials used to form semiconductor structure 100' are similar to, or the same as, those used to form semiconductor structure 100 described in FIGS. 1A to 1J, except the extending portion of the metal gate structure further extends under the spacers.

More specifically, the processes shown in FIGS. 1A to 1H are performed, and the details are not repeated herein. After dummy gate structure 118 is removed, trench 128 is further extended into isolation insulating layer 114 to form an extended trench 129' by etching dielectric layer 116 and isolation insulating layer 114, as shown in FIG. 2A in accordance with some embodiments.

Similar to that shown in FIG. 1I, first portion 116a of dielectric layer 116 exposed by trench 128 and an upper portion of isolation insulating layer 114 positioned below first portion 116a of dielectric layer 116 are removed. In addition, some portions of second portion 116b of dielectric layer 116 and isolation insulating layer 114 positioned below spacers 120 are also removed. In some embodiments, side walls of the portion of the extended trench 129' below the spacers 120 may have a flat profile as shown in FIG. 2A. In other embodiments, the side walls may have a curved profile as later shown in FIGS. 5C-5E and 6D-6F.

As shown in FIG. 2A, after the etching process, extended trench 129' further extends below spacers 120, such that metal gate structure 130' formed in extended trench 129' also extends below spacers 120, as shown in FIG. 2B in accordance with some embodiments. In some embodiments, metal gate structure 130' is similar to metal gate 130 shown in FIG. 1J and includes gate dielectric layer 132, work function metal layer 134, and metal gate electrode layer 136.

As shown in FIG. 2B, metal gate structure 130' is formed across fin structure 110 and extends over isolation insulating layer 114. More specifically, metal gate structure 130' includes a first portion 130a' formed over fin structure 110 and a second portion 130b' formed over isolation insulating layer 114. In addition, second portion 130b' further includes an extending portion 130c' extending into isolation insulating layer 114 and extending below spacers 120.

More specifically, extending portion 130c' extends to a position below spacer 120, such that a portion of extending portion 130c' overlaps with spacer 120. In some embodiments, the portion of extending portion 130c' overlapped with spacer 120 has a width W' in a range from about 0.5 nm to about 10 nm, or in a range of 1 nm to 5 nm in other embodiments. The formation of extending portion 130c' extending to a position below spacer 120 enables to enlarge the effective area of the structure. However, if the width W' is too great, the risk of bridging may also increase.

As shown in FIG. 2B, the width of extending portion 130c' is greater than that of first portion 130a' of metal gate structure 130' formed over fin structure 110. In some embodiments, first portion 130a' of metal gate structure 130' has a first width $W_1'$, and extending portion 130c' of metal gate structure 130' has a second width $W_2'$, which is greater than the first width $W_1'$. In some embodiments, the difference between the first width $W_1'$ and the second width $W_2'$ is in a range from about 0.5 nm to about 20 nm. The electrical performance may be adjusted by changing the second width $W_2'$ of extending portion 130c'. However, if the second width $W_2'$ of extending portion 130c' is too great, the risk of leakage may increase.

Similar to those shown in FIG. 1J, second portion 130a' of metal gate structure 130 has a second height $H_2'$, which is greater than the first height $H_1$ of spacer 120. In addition, extending portion 130c' has a thickness $T_1'$, which may also be defined as the difference between the first height $H_1'$ and the second height $H_2'$. In some embodiments, the thickness $T_1'$ of extending portion 130c' is in a range similar to, or the same as, the thickness $T_1$ of extending portion 130c described previously.

Figure 3A:
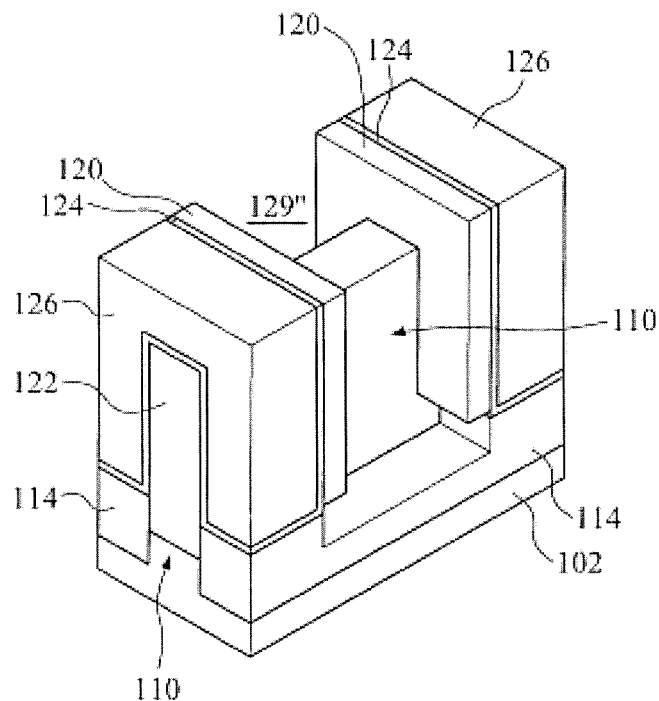
FIGS. 3A to 3B are cross-sectional representations of a semiconductor structure in accordance with some embodiments of the present disclosure.
Figure 3B:
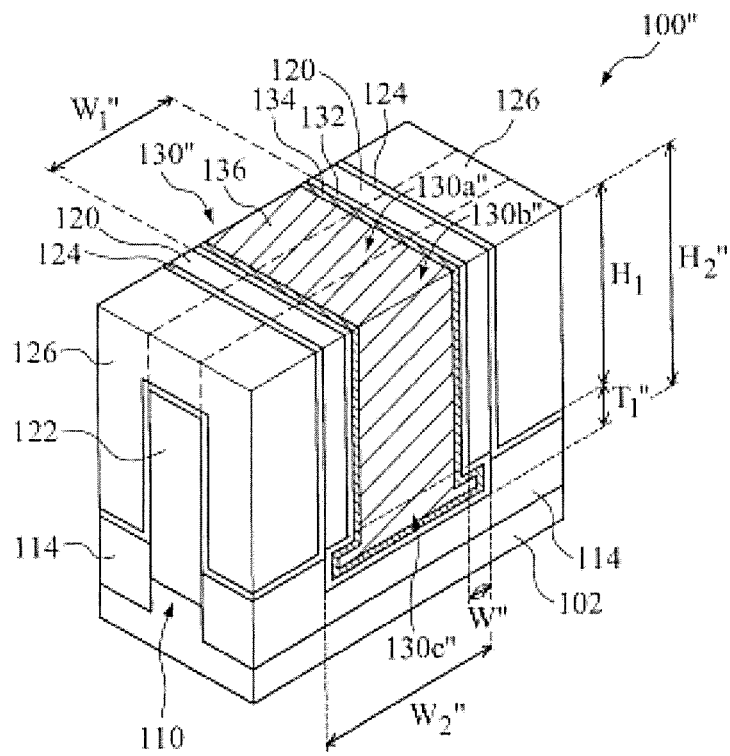

FIGS. 3A to 3B are cross-sectional representations of various stages of forming a semiconductor structure 100" in accordance with some embodiments. Methods and materials used to form semiconductor structure 100" are similar to, or the same as, those used to form semiconductor structures 100 and 100' described previously, except the second portion of dielectric layer formed below the spacers are completely removed and the extending portion extends below the spacers.

More specifically, the processes shown in FIGS. 1A to 1H are performed, and the details are not repeated herein. After dummy gate structure 118 is removed, trench 128 is further extended into isolation insulating layer 114 to form an extended trench 129" by etching dielectric layer 116 and isolation insulating layer 114, as shown in FIG. 3A in accordance with some embodiments.

Similar to that shown in FIG. 1I, first portion 116a of dielectric layer 116 exposed by trench 128 and an upper portion of isolation insulating layer 114 below first portion 116a of dielectric layer 116 are removed. In addition, second portion 116b of dielectric layer 116 and portions of isolation insulating layer 114 positioned below spacers 120 are also removed. That is, dielectric layer 116 shown in FIG. 1F is completely removed in the embodiments. In some embodiments, side walls of the portion of the extended trench 129" below the spacers 120 may have a flat profile as shown in FIG. 3A. In other embodiments, the side walls may have a curved profile as later shown in FIGS. 5C-5E and 6D-6F.

As shown in FIG. 3A, after the etching process, extended trench 129" extends further below spacers 120, and a metal gate structure 130" is formed in extended trench 129", as shown in FIG. 3B in accordance with some embodiments. In some embodiments, metal gate structure 130" is similar to metal gate structure 130 shown in FIG. 1J and includes gate dielectric layer 132, work function metal layer 134, and metal gate electrode layer 136.

As shown in FIG. 3B, metal gate structure 130" is formed across fin structure 110 and extends over isolation insulating layer 114. More specifically, metal gate structure 130" includes a first portion 130a" formed over fin structure 110 and a second portion 130b" formed over isolation insulating layer 114. In addition, second portion 130b" further includes an extending portion 130c" extending into isolation insulating layer 114 and extending below spacers 120.

As shown in FIG. 3B, the second portion of dielectric layer 116 formed below spacers 120 are completely removed, and the portion of extending portion 130c' which is overlapped with spacer 120 has a width W'" substantially equal to the width of spacer 120. In some embodiments, the width W'" of the portion of extending portion 130c' overlapped with spacer 120 is in a range from about 0.5 nm to about 10 nm.

In some embodiments, first portion 130a" of metal gate structure 130" has a first width $W_1"$, and extending portion 130c" of metal gate structure 130" has a second width $W_2"$, which is greater than the first width $W_1"$. In some embodiments, the difference between first width $W_1"$ and second width $W_2"$ is in a range from about 0.5 nm to about 20 nm.

Similar to those shown in FIG. 1J, second portion 130a" of metal gate structure 130 has a second height $H_2"$, which is greater than the first height $H_1$ of spacer 120. In addition, extending portion 130c" has a thickness $T_1"$, which may also be defined as the difference between first height $H_1$ and second height $H_2"$. In some embodiments, thickness $T_1"$ of extending portion 130c" is in a range similar to, or the same as, thickness $T_1$ of extending portion 130c described previously.

In a planar transistor, the electrical properties can be controlled by implantation. However, for a Fin FET transistor, it becomes difficult to control the electrical properties by implantation. Accordingly, in some embodiments of the disclosure, a metal gate structure, such as metal gate structures 130, 130', and 130", is used to adjust the electrical properties of the structure.

More specifically, the metal gate structure is formed in a "gate-last" process. That is, dummy gate structure 118 is formed across fin structure 110 and extends over isolation insulating layer 114, and spacers 120 are formed on the sidewalls of dummy gate structure 118. Afterwards, dummy gate structure 118 and a portion of isolation insulating layer 114 are removed to form an extended trench, such as extended trench 129, 129', and 129". Accordingly, the metal gate structure formed in the extended trench can have an extending portion, such as extending portion 130c, 130c', and 130c", extending into isolation insulating layer 114.

The extending portion of the metal gate structure provides a larger effect area for the metal gate structure and therefore the performance of the semiconductor structure, such as a Fin FET structure, can be improved. In addition, the extending portion may also be used to adjust the electrical properties of the semiconductor structure. In some embodiments, the extending portion, such as extending portion, further extends to a position below spacers to have an even larger effective area. That is, the size of the extending portion may be adjusted according to its application.

It should be noted that, although a relatively higher thus larger metal gate structure may also be formed by forming a higher thus larger dummy gate structure, the processes of forming the higher dummy gate structure may be quite challenging. For example, a fin with a high aspect ratio should be formed and a great amount of the insulating layer should be etched to form a shallow trench isolation insulating layer. These processes may result in poor uniformity and the yield of manufacturing the structure may be decreased.

On the other hand, by using the processes described in FIGS. 1A to 3B, the metal gate structure having a relatively larger height can be formed without using the processes described above. Therefore, the uniformity of manufacturing the structure can be improved. In addition, the methods described above can be implemented in present manufacturing processes without using additional complicated processes, such as masking or alignment. Therefore, metal gate structures can be formed without changing or affecting other manufacturing processes. Accordingly, the performance of semiconductor structures can be improved, and the yield can be increased.

FIG. 4A-24C show exemplary semiconductor devices and methods for manufacturing the semiconductor devices according to other aspects of the present disclosure. It is noted that the same or similar structures, configurations, dimensions, processes, operations and/or materials described above with respect to FIG. 1A to FIG. 3B may be used and applicable to the following embodiments. Conversely, the same or similar structures, configurations, dimensions, processes, operations and/or materials described in the following embodiments may use used and applicable to the embodiments as set forth above with respect to FIG. 1A to FIG. 3B.

Figure 4A:
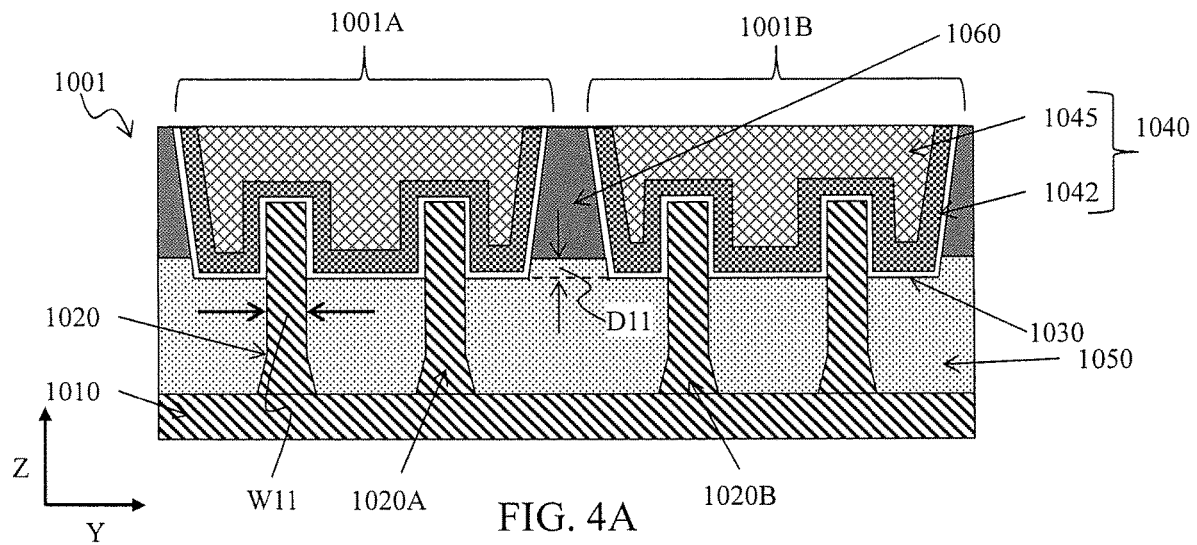
FIG. 4A is an exemplary cross sectional view of a semiconductor FET device having a fin structure (Fin FET)
Figure 4B:
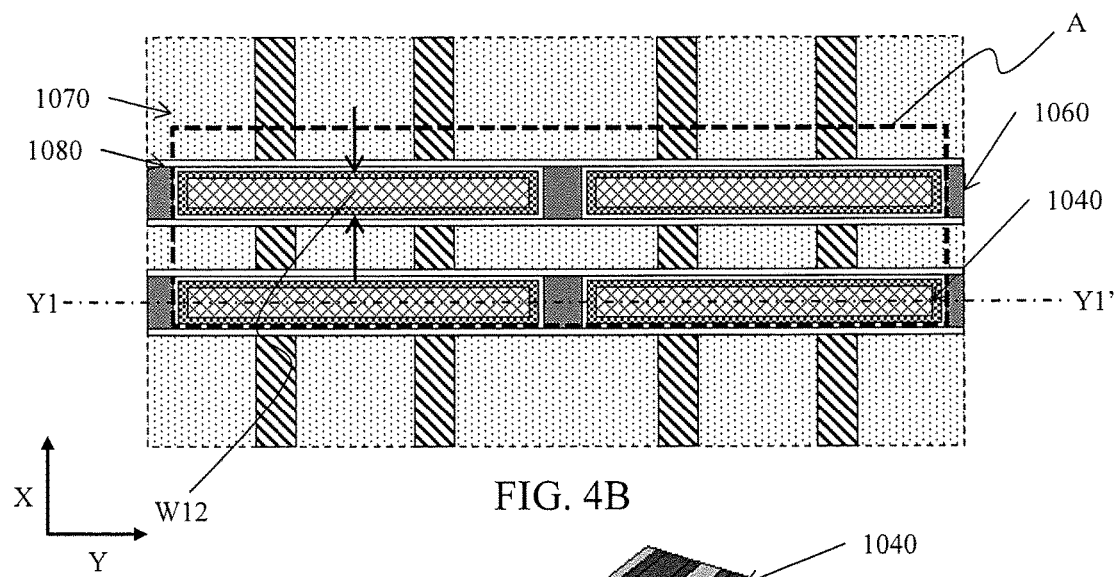
FIG. 4B is an exemplary top view of the semiconductor FET device having a fin structure.
Figure 4C:
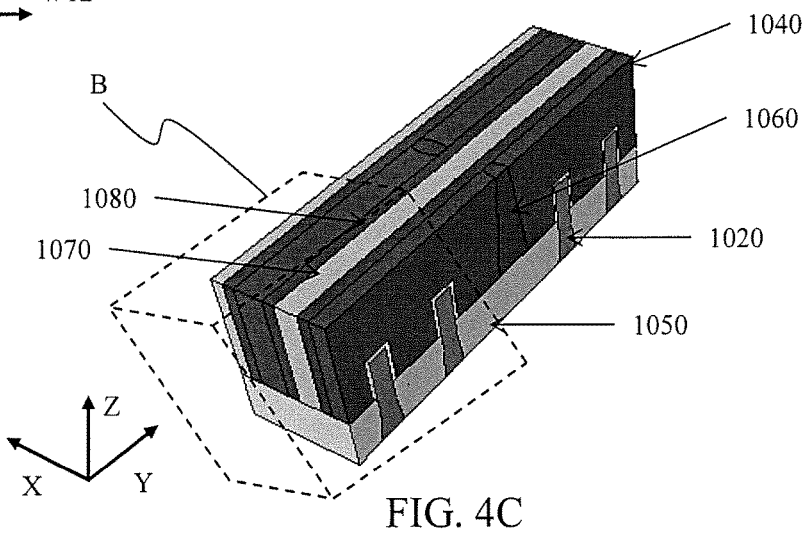
FIG. 4C is an exemplary perspective view of the semiconductor FET device having a fin structure, corresponding to the enclosed portion in FIG. 4B, according to one embodiment of the present disclosure.

FIG. 4A is an exemplary cross sectional view of a semiconductor FET device having a fin structure (Fin FET), FIG. 4B is an exemplary top view of the semiconductor FET device having a fin structure, and FIG. 4C is an exemplary perspective view of the semiconductor FET device having a fin structure according to one embodiment of the present disclosure. FIG. 4A is the cross sectional view along line Y1-Y1' in FIG. 4B, and FIG. 4C corresponds to the enclosed portion A in FIG. 4B. In these figures, some layers/features are omitted for simplification. FIGS. 4A-4C show the device structure after a metal gate structure has been formed.

The Fin FET device 1001 includes a first device region 1001A and a second device region 1001B. The first device region 1001A includes one or more first Fin FET devices, and the second device region includes one or more second Fin FET devices. A channel type of the first Fin FET transistor is the same as or different from a channel type of the second Fin FET transistor.

In one embodiment, the first device region 1001A includes p-type MOS FETs and the second device region 1001B includes n-type MOS FETs. In other embodiments, the first and second device regions include p-type MOS FETs, the first and second device regions include n-type MOS FETs or the first and second device regions include both p-type and n-type MOS FETs.

The Fin FET device 1001 includes, among other features, a substrate 1010, fin structures 1020, a gate dielectric 1030 and a gate electrode 1040. Materials used for a substrate are similar to, or the same as, one used to form substrate 102 described in FIG. 1A.

The fin structure 1020 is disposed over the substrate 1010. The fin structure 1020 may be made of the same material as the substrate 1010 and may continuously extend from the substrate 1010. In this embodiment, the fin structure is made of Si. The silicon layer of the fin structure 1020 may be intrinsic, or appropriately doped with an n-type impurity or a p-type impurity.

In FIG. 4A, two fin structures 1020 are disposed in the first device region 1001A and in the second device region 1001B, respectively. However, the number of the fin structures is not limited to two (or four). The numbers may be one, two, three or five or more. In addition, one or more dummy fin structures may be disposed adjacent both sides of the fin structures 1020 to improve pattern fidelity in patterning processes. The width W11 of the fin structure 1020 is in a range of about 5 nm to about 40 nm in some embodiments, and may be in a range of about 7 nm to about 15 nm in certain embodiments. The height of the fin structure 1020 along the Z direction is in a range of about 100 nm to about 300 nm in some embodiments, and may be in a range of about 50 nm to 100 nm in other embodiments.

The lower part of the fin structure 1020 under the gate electrode 1040 is referred to as a well layer, and the upper part of the fin structure 1020 is referred to as a channel layer. Under the gate electrode 1040, the well layer is embedded in the isolation insulating layer 1050, and the channel layer protrudes from the isolation insulating layer 1050. A lower part of the channel layer may also be embedded in the isolation insulating layer 1050 to a depth of about 1 nm to about 5 nm.

The height of the well layer is in a range of about 60 nm to 100 nm in some embodiments, and the height of the channel layer is in a range of about 40 nm to 60 nm.

Further, spaces between the fin structures 1020 and/or a space between one fin structure and another element formed over the substrate 1010 are filled by an isolation insulating layer 1050 (or so-called a "shallow-trench-isolation (STI)" layer) including an insulating material, and an interlayer dielectric layer 1070 disposed over the isolation insulating layer 1050. The insulating material for the isolation insulating layer 1050 and the interlayer dielectric layer 1070 may include one or more layers of silicon oxide, silicon nitride, silicon oxynitride (SiON), SiOCN, fluoride-doped silicate glass (FSG), or a low-K dielectric material. The insulating material for the isolation insulating layer 1050 may be the same as or different from that for the interlayer dielectric layer 1070.

The channel layer of the fin structure 1020 protruding from the isolation insulating layer 1050 is covered by a gate dielectric layer 1030, and the gate dielectric layer 1030 is further covered by a gate electrode 1040. Part of the channel layer not covered by the gate electrode 1040 functions as a source and/or drain of the MOS FET (see, FIG. 4B). The fin structures 1020 extend in a first direction (e.g., the X direction) and the gate electrodes 1040 extends in a second direction (e.g., the Y direction) perpendicular to the first direction.

In some embodiments, the work function adjustment layer may include a first metal material for the p-channel Fin FET (e.g., in the first device region 1001A) and a second metal material for the n-channel Fin FET (e.g., in the second device region 1001B). For example, the first metal material for the n-channel Fin FET may include metals having a work function substantially aligned with a work function of the substrate conduction band, or at least substantially aligned with a work function of the conduction band of the channel layer of the fin structure 1020. Similarly, for example, the second metal material for the p-channel Fin FET may include metals having a work function substantially aligned with a work function of the substrate valence band, or at least substantially aligned with a work function of the valence band of the channel layer of the fin structure 1020. In some embodiments, the work function adjustment layer may alternately include a polysilicon layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions are also formed in the fin structure not covered by the gate electrode 1040, by appropriately doping impurities in the source and drain regions. An alloy of Si or Ge and a metal such as Co, Ni, W, Ti or Ta may be formed on the source and drain regions 1025. Si and/or SiGe layers may be epitaxially formed in the source-drain regions to form a raised source-drain structure and to apply appropriate stresses to the channel layer.

Further, side-wall insulating layers 1080 (spacer layers) are disposed at both vertical sides of the gate electrode 1040 in some embodiments. The gate electrode 1040 and the source/drain regions are covered by the interlayer dielectric layer 1070, and necessary wirings and/or via/contact holes are disposed so as to complete the semiconductor device.

The width W12 of the gate electrode 1040 including the work function adjusting layer 1042 and the metal gate layer 1045 is in a range of about 20 nm to 40 nm in some embodiments. When plural gate electrodes 1040 are arranged in the width direction (see, FIG. 4B), a pitch of the gate electrodes is in a range of about 60 nm to 100 nm in some embodiments.

As shown in FIGS. 4A-4C, adjacent gate electrodes 1040 are separated from each other by a separation plug 1060 made of an insulating material. In the cross section shown in FIG. 4A, the separation plug 1060 has a tapered shape having a smaller top size (width) and a larger bottom size (width). The width at the top of the separation plug is less than about 20 nm in certain embodiments and may be in a range of about 5 nm to about 15 nm in some embodiments. The width at the bottom of the separation plug is less than about 35 nm in certain embodiments and may be in a range of about 10 nm to about 30 nm in some embodiments. Here, the top of the separation plug corresponds to the upper surface of the gate electrode 1040 and the bottom of the separation plug 1060 corresponds to the bottom of the gate dielectric layer 1030 or the interface between the isolation insulating layer 1050 and the interlayer dielectric layer 1070. The insulating material for the separation plug 1070 may include silicon oxide, silicon nitride, silicon oxynitride (SiON), SiOCN, fluoride-doped silicate glass (FSG), or a low-K dielectric material, and may be the same as or different from the materials for the insulating material for the isolation insulating layer 1050 and/or the interlayer dielectric layer 1070.

The insulating material for the separation plug 1070 may be the same as or may be different from an insulating material for the isolation insulating layer 1050 and/or the interlayer dielectric layer 1070.

In one embodiment of the present disclosure, a bottom part of the gate electrode 1040 is embedded in the isolation insulating layer by a depth D11.

FIGS. 5A-5E show exemplary perspective view of the enclosed portion B of FIG. 4C, according to some embodiments of the present disclosure. FIGS. 6A-6F show exemplary cross sectional view of the enclosed portion B of FIG. 4C along the X direction not traversing the fin structures (e.g., between the fin structures) according to some embodiments of the present disclosure.

According to one embodiment of the present disclosure, a recess 1055 is provided in the upper surface of the isolation insulating layer 1050. The materials constituting the gate electrode 1040 are filled in the recess 1055. Accordingly, a height H11 of the gate structure 1041 including the electrode 1040 and the gate dielectric layer 1030 is greater than a height H12 of the side-wall insulating layers 1080. The difference D12 between H11 and H12 is in a range about 1 nm to 200 nm, in one embodiment. The minimum value of D12 may be any value of 1 nm, 3 nm, 10 nm, 80 nm, 120 nm or 150 nm, and the maximum value of D12 may be any value of 5 nm, 30 nm, 80 nm, 120 nm, 150 nm or 200 nm.

Figure 5B:
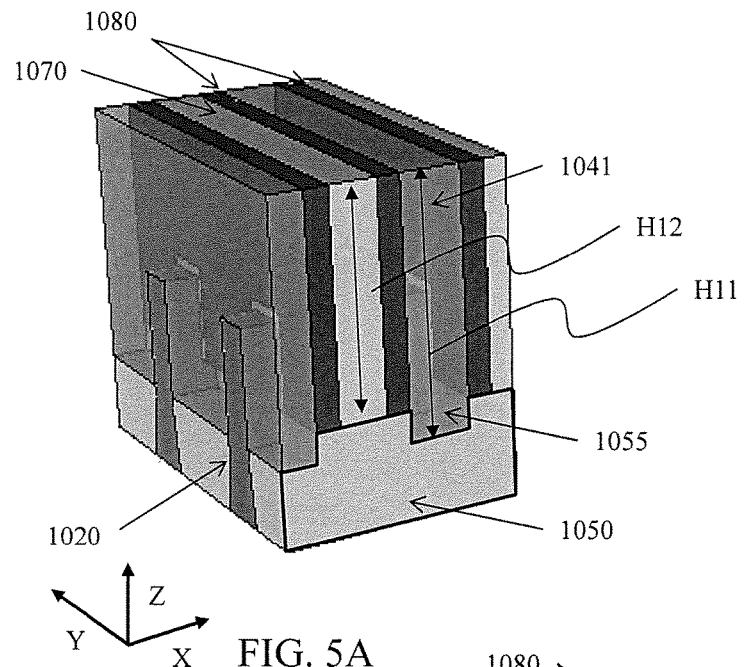
Figures 6A, 6B:
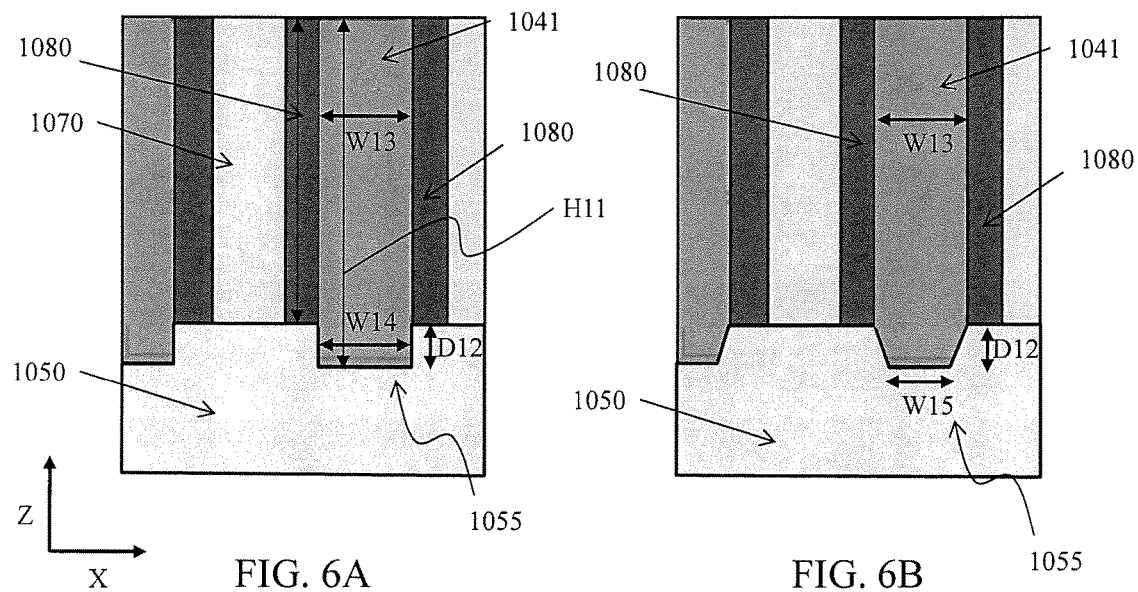
FIGS. 6A-6G show exemplary cross sectional views of the enclosed portion of FIG. 4C, according to some embodiments of the present disclosure.

As shown in FIGS. 5A and 6A, in one embodiment of the present disclosure, a width W14 of the recess 1055 in the X direction is substantially the same as a width W13 of the gate structure 1041 including the electrode 1040 and the gate dielectric layer 1030. A shown in FIG. 6B, a width W15 at the bottom of the recess may be smaller than W13, in some embodiments. The width W15 may be in a range of about ½ to about ⅔ of W13 in some embodiments, and may be in a range of about ⅔ to about ¾ of W13 in another embodiment. A wall of the recess may have a flat profile (straight wall) face or a curved profile (curved wall).

Figure 6C:
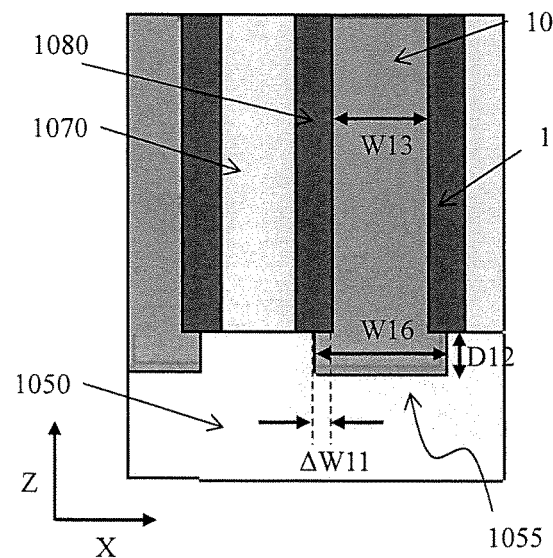

As shown in FIGS. 5B and 6C, in another embodiment of the present disclosure, a width W16 of the recess 1055 is greater than the width W13 of the gate structure. The wall of the recess may be substantially flat. Since the width W16 is greater than the width W13, the materials constituting the gate structure are disposed under the side-wall insulating layer 1080. The interface between the gate structure 1041 and the isolation insulating layer 1050 is located under the side-wall insulating layer 1080. More specifically, an end of the metal material constituting the gate electrode 1040 is located under the side-wall insulating layer 1080. The difference between W16 and W13 may be in a range of about 1 nm to about 20 nm in some embodiments or in a range of about 2 nm to about 10 nm in other embodiments, and equal to or less than twice of the thickness of the side-wall insulating layer 1080. In other words, ΔW11 shown in FIG. 6A (the difference between a lateral end of the recess 1055 and the side face of the side-wall insulating layer 1080) may be in a range of about 0.5 nm to about 10 nm or about 1 nm to about 5 nm. In certain embodiments, the end of the metal material constituting the gate electrode 1040 may be located under the interlayer dielectric layer 1070 beyond the sidewall insulating layer 1080. In such a case, however, the width W16, W16a, W16b or W16c should be adjusted so as to avoid a short circuit between two adjacent gate electrodes under the interlayer dielectric layer 1070.

As shown in FIGS. 5C-5E and 6D-6E, in another embodiment of the present disclosure, a maximum width W16a, W16b or W16c of the recess 1055 is greater than the width W13 of the gate structure, and the wall of the recess 1055 has a curved profile.

Figure 5C:
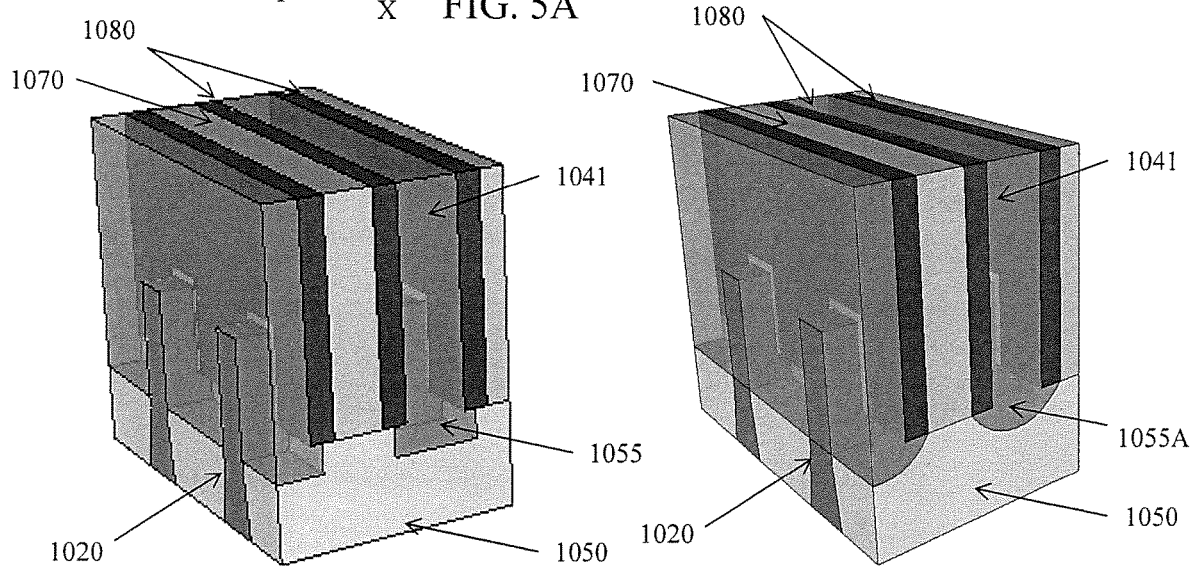
Figure 6D:
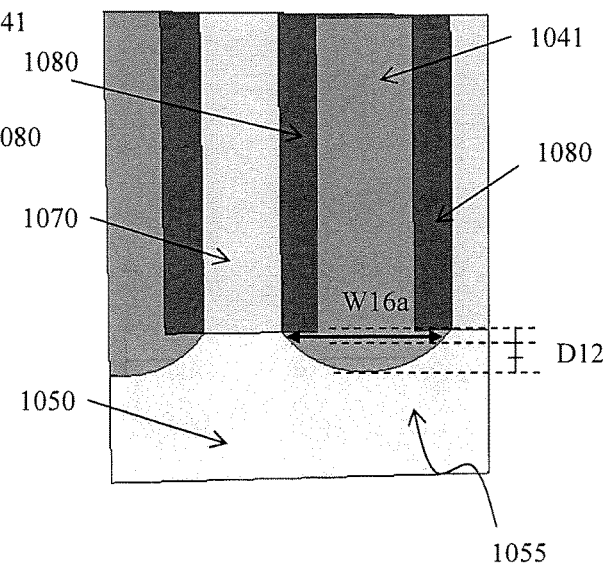

In FIGS. 5C and 6D, the maximum width W16a is located at a depth between 0 and ⅓ of D12 from the uppermost surface of the isolation insulating layer 1050 (a level of the interface between the isolation insulating layer 1050 and the interlayer dielectric layer 1070 and/or the side-wall insulating layer 1080).

Figures 5D, 5E:
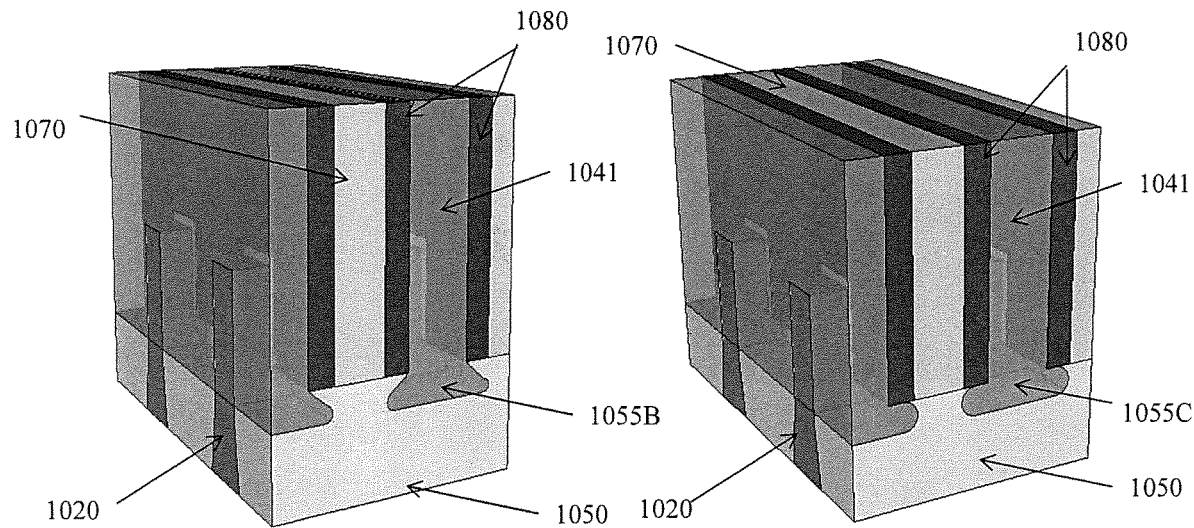
Figure 6E:
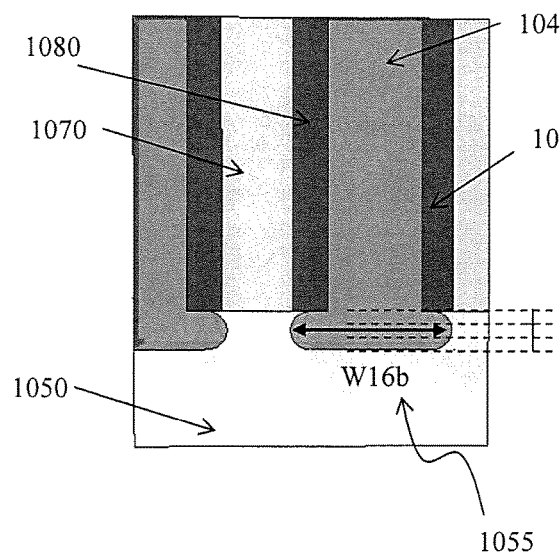

In FIGS. 5D and 6E, the maximum width W16b is located at a depth between ⅓ and ⅔ of D12 from the uppermost surface of the isolation insulating layer 1050.

Figure 6F:
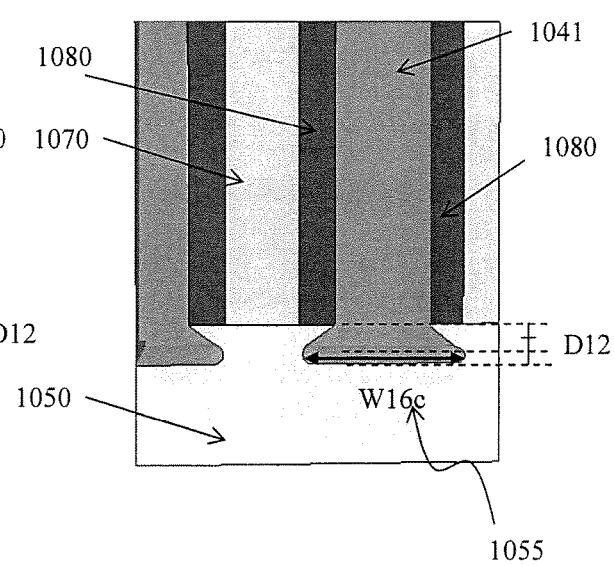

In FIGS. 5E and 6F, the maximum width W16c is located at a depth between ⅔ of D12 and D12 from the uppermost surface of the isolation insulating layer 1050.

With the foregoing structures of the recess in the isolation insulating layer 1050 and the gate electrode materials filled in the recess, it is possible to enlarge a surface area of the channel layer of the fin structure to be covered by the gate electrode. In the structures of FIGS. 5A, 6A and 6B, the surface area can be vertically enlarged, and in the structures of FIGS. 5B-5E and 6C-6F, the surface area can be vertically and horizontally enlarged.

Figure 6G:
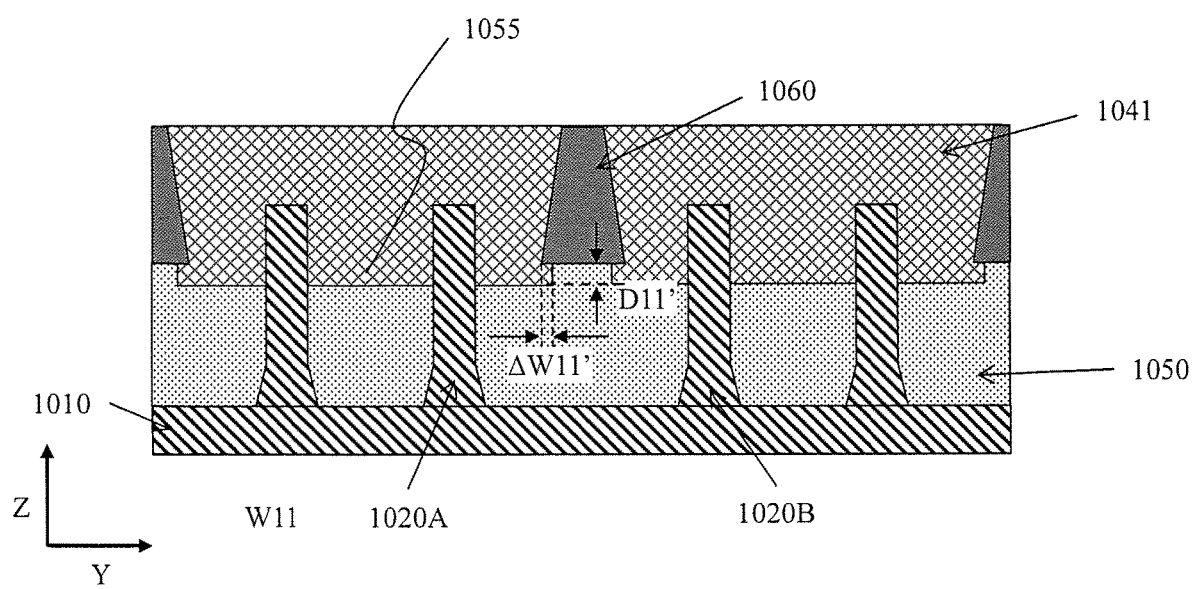

Along the Y direction, as shown in FIG. 6G, the recess 1055 may also penetrate under the separation plug 1060. In FIG. 6G, the gate dielectric layer is not shown. An amount of penetration ΔW11' may be in a range of about 0.5 nm to about 10 nm or about 1 nm to about 5 nm. In some embodiments, ΔW11' is zero. The amount ΔW11' may be equal to ΔW11 (see, FIG. 6C) or smaller than ΔW11 in certain embodiments. Yet in another embodiment, the amount ΔW11' may be greater than ΔW11. The depth D11' is substantially the same as the depth D12 shown in FIGS. 6A-6C, and recess 1055 under the separation plug 1060 also has substantially the same shapes as the shapes shown in FIGS. 5A-6C. Yet in another embodiment, the recess 1055 may not penetrate under the separation plug 1060.

FIGS. 7-14 show cross sectional views of exemplary sequential operations of manufacturing the Fin FET device according to one embodiment of the present disclosure. It is understood that additional operations can be provided before, during, and after operations shown by FIGS. 7-14, and some of the operations described below can be replaced or eliminated, for additional embodiments of the method. The order of the operations may be interchangeable. Further, the general operations for manufacturing a metal gate structure over the fin structure by gate replacement technologies are disclosed in U.S. Patent Publication No. 2013/016176, the entire contents of which are incorporated herein by reference.

The operations for manufacturing a semiconductor device in this embodiment generally include, among other operations, forming a first fin structure and a second fin structure extending in a first direction. A dummy electrode structure is formed. The dummy electrode structure includes a dummy electrode layer, side wall insulating layers disposed at both vertical sides of the dummy electrode layer and interlayer dielectric layers disposed at both vertical sides of the side wall insulating layers. The dummy electrode structure is disposed over an isolation insulating layer and extends in a second direction perpendicular to the first direction. The dummy electrode layer is patterned so that the dummy electrode layer is divided into at least a first dummy electrode and a second dummy electrode separated by an opening. The first dummy electrode layer covers part of the first fin structure, and the second dummy electrode layer covers the second fin structure. A separation plug is formed by filling the opening with an insulating material. The first and second dummy electrodes are removed so that a first electrode space and a second electrode space are formed and the separation plug is exposed between the first electrode space and the second electrode space. A surface of the isolation layer in the first and second electrode spaces is etched so as to form a first recess in the first space and a second recess in the second space. A first gate structure and a second gate structure are formed in the first electrode space and the second electrode space, respectively. Lateral ends of at least one of the first recess and the second recess along the first direction penetrate under the side wall insulating layers. At least one of the first recess and the second recess has a curved profile in a cross section along the first direction.

To fabricate a fin structure, a mask layer is formed over the substrate 1010 by, for example, thermal oxidation and/or chemical vapor deposition (CVD). The substrate 1010 is, for example, a p-type silicon substrate with an impurity concentration in a range of about $1.12 \times 10^{15}$ cm$^{-3}$ and about $1.68 \times 10^{15}$ cm$^{-3}$. In other embodiments, The substrate 1010 is an n-type silicon substrate with an impurity concentration in a range of about $0.905 \times 10^{15}$ cm$^{-3}$ and about $2.34 \times 10^{15}$ cm$^{-3}$. The mask layer includes, for example, a pad oxide (e.g., silicon oxide) layer and a silicon nitride mask layer in some embodiments.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a photo resist pattern formed by photo lithography.

By using the mask pattern as an etching mask, a hard mask pattern 1100 of the pad oxide layer 1106 and the silicon nitride mask layer 1107 is formed. The width of the hard mask pattern is in a range of about 5 nm to about 40 nm in some embodiments. In certain embodiments, the width of the hard mask patterns is in a range of about 7 nm to about 12 nm.

Figure 7:
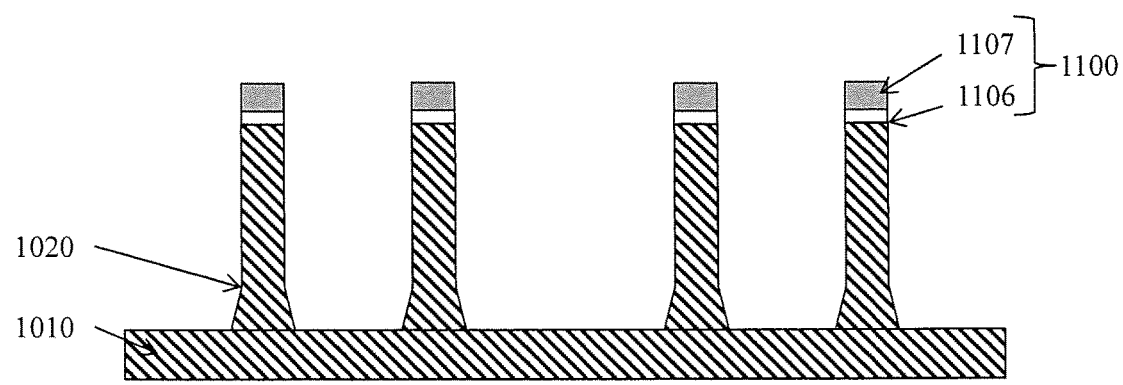
FIGS. 7-17 show exemplary processes for manufacturing a Fin FET device according to one embodiment of the present disclosure.

As shown in FIG. 7, by using the hard mask pattern as an etching mask, the substrate 1010 is pattered into fin structures 1020 by trench etching using a dry etching method and/or a wet etching method. A height of the fin structure 1020 is in a range of about 100 nm to about 300 nm. In certain embodiments, the height is in a range of about 50 nm to about 100 nm. When the heights of the fin structures are not uniform, the height from the substrate may be measured from the plane that corresponds to the average height of the fin structures.

In this embodiment, a bulk silicon wafer is used as a starting material and constitutes the substrate 1010. However, in some embodiments, other types of substrate may be used as the substrate 1010. For example, a silicon-on-insulator (SOI) wafer may be used as a starting material, and the insulator layer of the SOI wafer constitutes the substrate 1010 and the silicon layer of the SOI wafer is used for the fin structure 1020.

Figure 8:
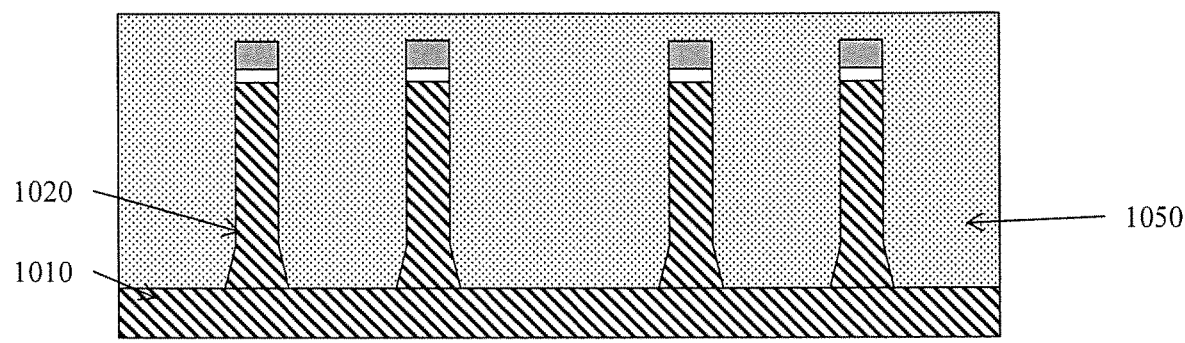

As shown in FIG. 8, an isolation insulating layer 1050 is formed over the substrate 1010 so as to fully cover the fin structure 1020.

The isolation insulating layer 1050 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1050 may be formed by one or more layers of SOG, SiO, SiON, SiOCN and/or fluoride-doped silicate glass (FSG) in some embodiments.

Figure 9:
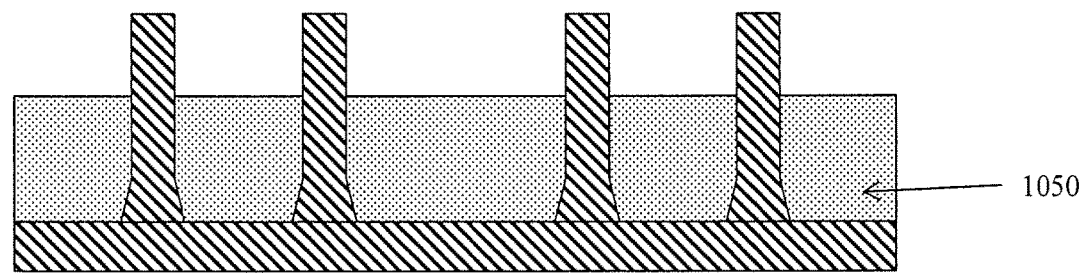

After forming the isolation insulating layer 1050, a planarization operation is performed so as to remove part of the isolation insulating layer 1050 and the mask layer 1100 including the pad oxide layer 1106 and the silicon nitride mask layer 1107. Then, the isolation insulating layer 1050 is further removed so that an upper part of the fin structure 1020, which is to become a channel layer, is exposed, as shown in FIG. 9.

After forming the isolation insulating layer 1050, a thermal process, for example, an anneal process, may be performed to improve the quality of the isolation insulating layer 1050. In certain embodiments, the thermal process is performed by using rapid thermal annealing (RTA) at a temperature in a range of about 900° C. to about 1050° C. for about 1.5 seconds to about 10 seconds in inert gas ambient, for example, $N_2$, Ar or He ambient.

A sacrificial gate dielectric layer 1105 and a poly silicon layer are formed over the isolation insulating layer 1050 and the exposed fin structures 1020, and then patterning operations are performed so as to obtain a poly gate layer 1110 made of poly silicon. The sacrificial gate dielectric layer 1105 may be one or more layers of silicon oxide, silicon nitride or silicon oxynitride formed by CVD, PVD, ALD, e-beam evaporation, or other suitable process. A thickness of the poly silicon layer is in a range of about 5 to about 100 nm in some embodiments.

Side-wall insulating layers 1080 are also formed at both vertical sides of the poly gate layer 1110.

Figure 10A:
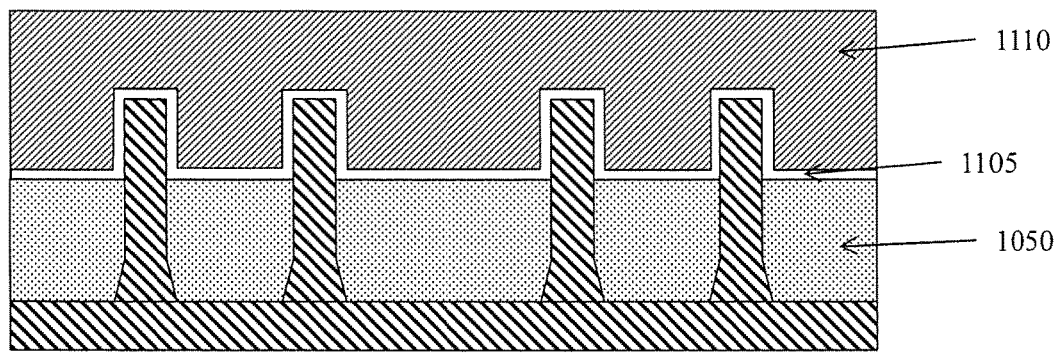
Figure 10B:
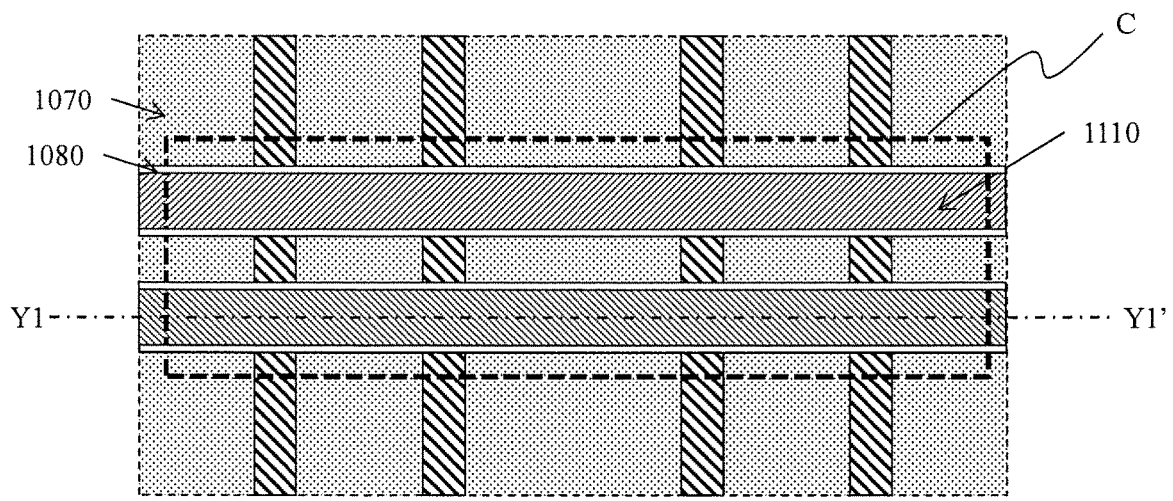
Figure 10C:
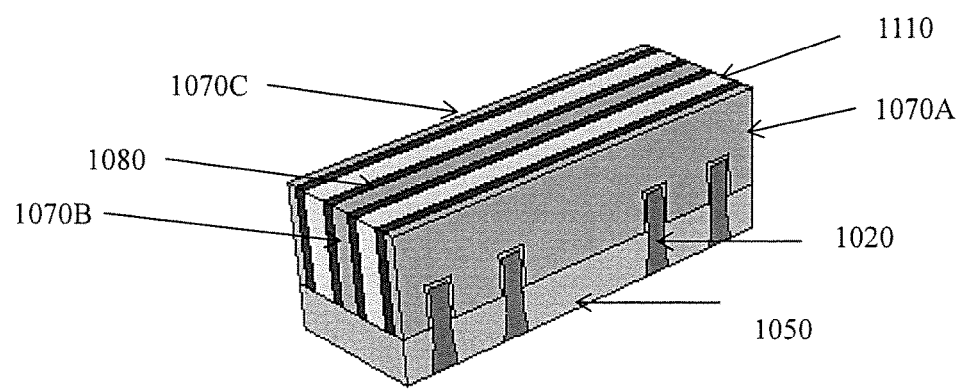

Further, an interlayer dielectric layer 1070 is formed in spaces between the poly gate layers 1110, the side-wall insulating layers 1080 and over the poly gate layer 1110. Planarization operations, such as an etch back process and/or a chemical mechanical polishing (CMP) process, are performed, so as to obtain the structure shown in FIGS. 10A-10C. FIG. 10A is the cross sectional view, FIG. 10B is the top view, and FIG. 10C is a perspective view of the Fin FET device after the poly gate layer 1110 and the interlayer dielectric layer 1070 are formed. FIG. 10A is the cross sectional view along line Y1-Y1' in FIG. 10B, and FIG. 10C corresponds to the enclosed portion C in FIG. 10B.

As shown in FIGS. 10B and 10C, in certain embodiments, the poly gate layers 1110 are formed in a line-and-space arrangement extending in one direction with a constant pitch. The poly gate layer 1110 may include another line-and-space arrangement extending in another direction perpendicular to the one direction.

Figure 11:
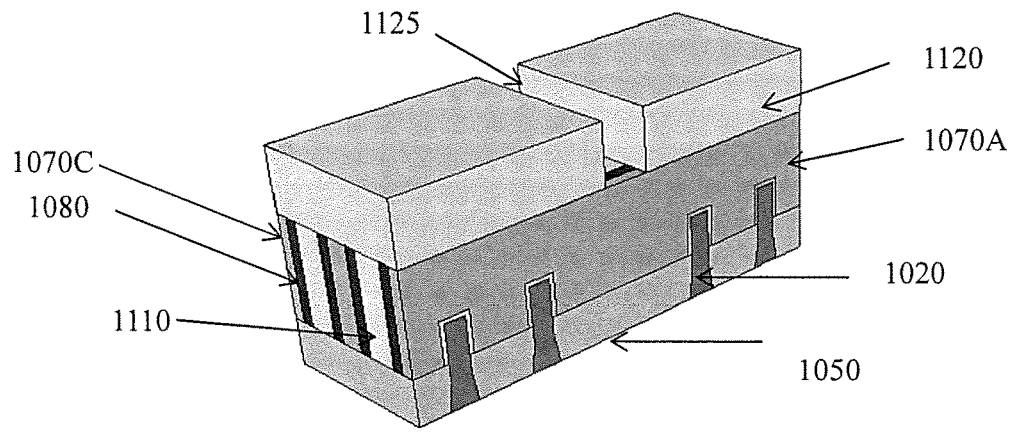

As shown in FIG. 11, a mask pattern 1120 is formed over the structure shown in FIG. 10C. The mask pattern 1120 is formed by, for example, a photo resist layer having a slit 1125. A width of the slit 1125 is in a range of about 5 nm to about 100 nm, in some embodiments.

Figure 12:
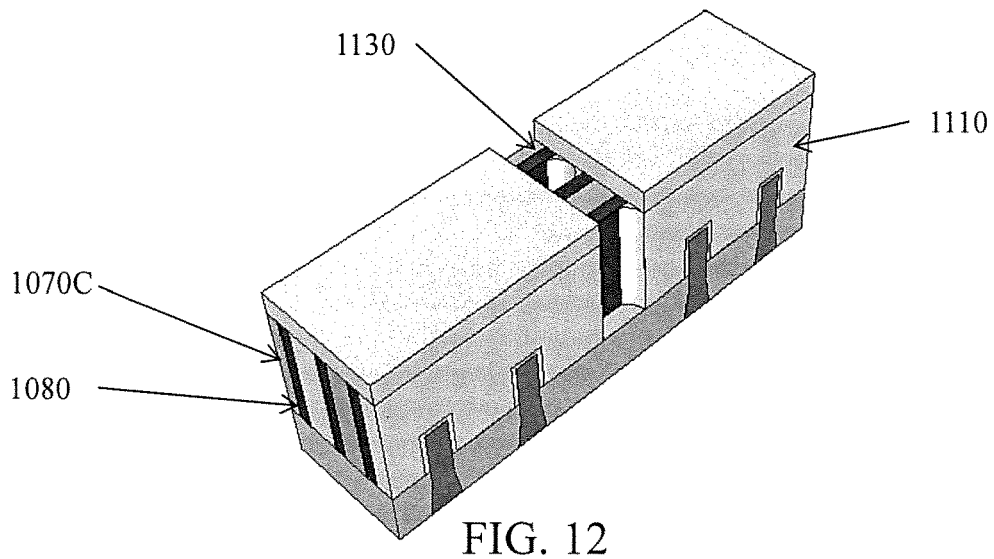

As shown in FIG. 12, by using the mask pattern 1120, a part of poly gate layer is etched. In FIG. 12 and thereafter, one layer 1070A of the interlayer dielectric layers 1070 is omitted to illustrate the etched poly gate layer 1110, while other layers 1070B and 1070C are still shown. The etching of the poly gate layer is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments.

The mask pattern 1120 (photo resist pattern) is removed by an ashing process and/or a wet cleaning process.

Figure 13:
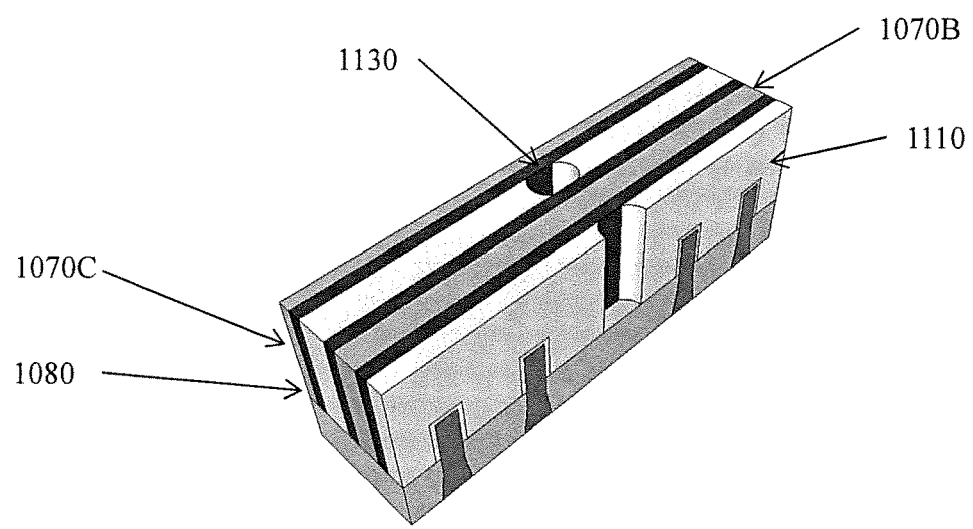

FIG. 13 shows the resultant structure after openings 1130 that separate the poly gate layers 1110 are formed. In FIG. 13, the top shape of the opening 1130 is circular. However, the shape may be rectangular, rectangular with rounded corners or ellipsoid, depending on dimensions of the structure, patterning conditions of the mask pattern 1120 and/or etching conditions for the poly gate layer 1110.

It is also noted that the cross sectional view of the opening 1130 has a tapered shape having a larger top size and a smaller bottom size, a straight shape, or a reverse tapered shape having a smaller top size and a larger bottom size.

An insulating material is formed over the structure shown in FIG. 13, by using, for example, a CVD process, and the opening 1130 is filled with the insulating material. The CVD process may include a LPCVD process, a plasma CVD process and/or a flowable CVD process. In the flowable CVD process, gases including $SiH_4$, $NH_3$, $N_2$, $O_2$, $N_2O$, $Cl_2$ and/or $NO_2$ may be used and the deposition is performed at a temperature in a range about 200° C. to about 1000° C., in some embodiments.

Figure 14:
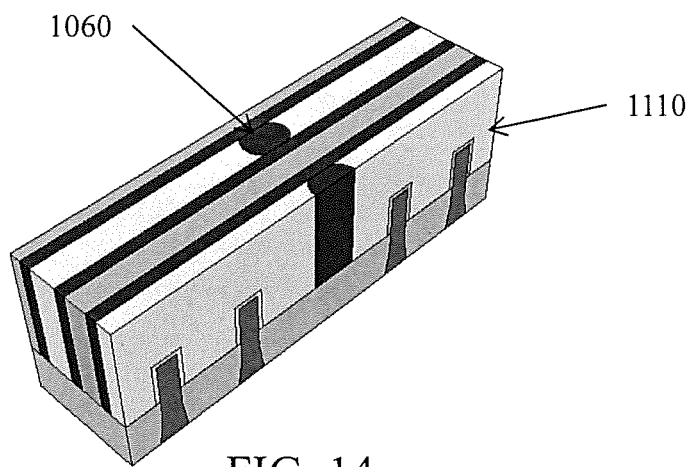

After the unnecessary portion of the insulating material formed over the poly gate layers, side-wall insulating layers and interlayer dielectric layers, is removed by planarization operations, separation plugs 1060 are obtained, as shown in FIG. 14. The planarization operations may include a CMP and/or an etch-back process.

Figure 15:
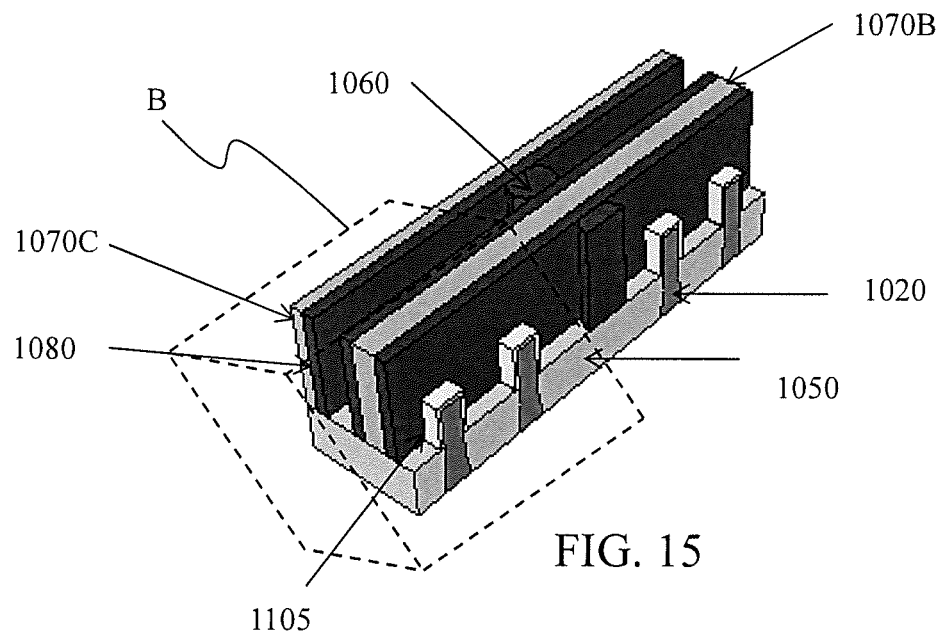

After forming the separation plugs 1060, the poly gate layers 1110 are removed by dry etching and/or wet etching. By removing the poly gate layers 1110, the separation plugs 1060 are exposed, as shown in FIG. 15. Since the upper portions of the fin structures 1020 are covered by the gate oxide 1105, the fin structures 1020 are not etched in the poly gate etching process.

Figure 16:
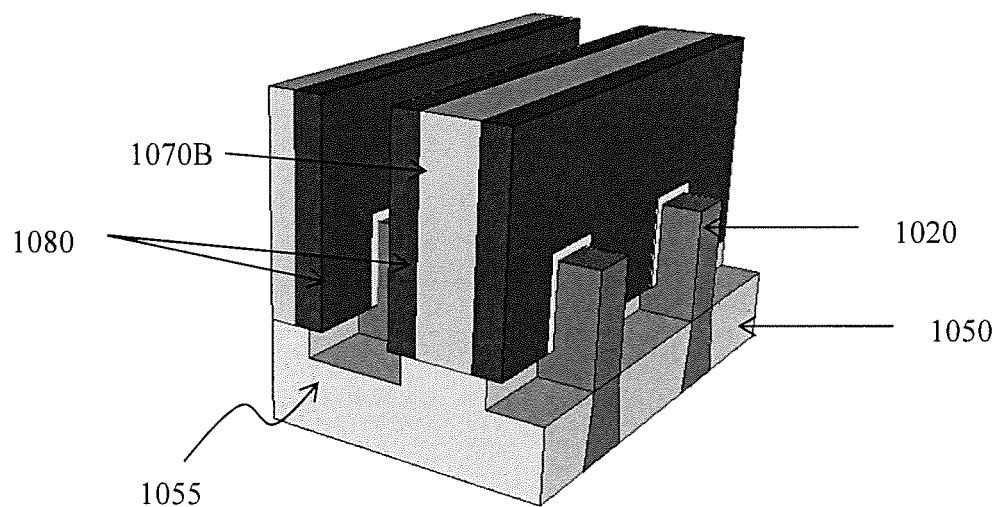

As shown in FIG. 16, which is an enlarged view of the enclosed portion B in FIG. 15, the sacrificial gate dielectric layer 1105 and a part of the isolation insulating layer 1050 is etched. By this etching, the recess 1055 is formed in the isolation insulating layer 50 at portions adjacent to the fin structures 1020 and, in some embodiments, under the side-wall insulating layer 1080. This etching process may include isotropic dry etching For example, transform coupled plasma (TCP) with process gases including $CH_2F_2$, $SF_6$, $O_2$, HBr, He, $Cl_2$, $NF_3$, $CF_4$ and/or $N_2$ is used in a low pressure of about 1 to 100 Torr.

The depth of the recess 1055 in the upper surface of the isolation insulating layer 1050 is in a range about 1 nm to 200 nm, in one embodiment. The minimum value of the depth of the recess may be any value of 1 nm, 3 nm, 10 nm, 80 nm, 120 nm or 150 nm, and the maximum value of the depth of the recess may be any value of 5 nm, 30 nm, 80 nm, 120 nm, 150 nm or 200 nm.

In one embodiment of the present disclosure, a width of the recess in the X direction is substantially the same as a width of the space formed by the side-wall insulating layers 1080. A width at the bottom of the recess may be smaller than the width of the space, in some embodiments. The width of the recess bottom may be in a range of about ½ to about ⅔ of the width of the space in some embodiments, and may be in a range of about ⅔ to about ¾ of the width of the space in other embodiments. A wall of the recess may be flat or curved.

In another embodiment of the present disclosure, a width of the recess 1055 is greater than the width of the space formed by the side-wall insulating layer 1080. The wall of the recess 1055 may be substantially flat. Since the width of the recess is greater than the width of the space. A lateral end (in the X direction) of the recess 1055 is located under the side-wall insulating layer 1080. The difference between the width of the recess and the width of the space may be in a range of about 1 nm to about 10 nm in some embodiments or in a range of about 1 nm to about 5 nm in other embodiments, and equal to or less than twice of the thickness of the side-wall insulating layer 1080.

In another embodiment of the present disclosure, a maximum width of the recess 1055 is greater than the width of the space formed by the side-wall insulating layers 1080, and the recess 1055 has a curved profile. The maximum width may be located at a depth between 0 and ⅓ of the depth of the recess from the uppermost surface of the isolation insulating layer 1050 (a level of the interface between the isolation insulating layer 1050 and the interlayer dielectric layer 1070 and/or the side-wall insulating layer 1080), located at a depth between ⅓ and ⅔ of the depth of the recess or located at a depth between ⅔ of the depth of the recess and the bottom of the recess.

After the operations in FIG. 16, a metal gate structure is formed in the space between the separation plug, which is created by removing the poly gate layers 1110, and, in some embodiments, under the side-wall insulating layer 1080, thereby obtaining the structure shown in FIG. 17 and FIGS. 5A-5E.

Figure 17:
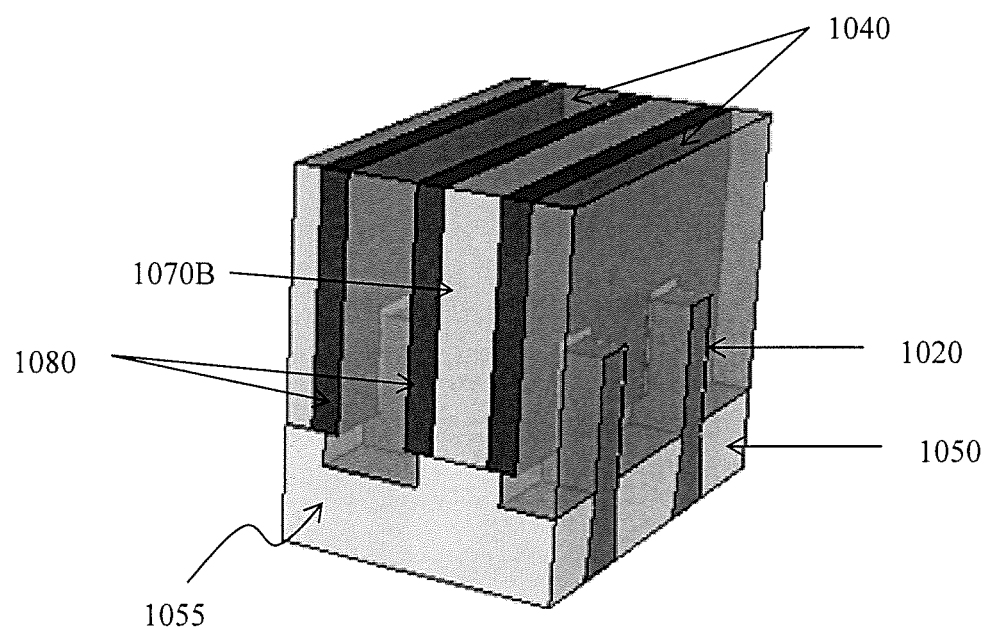

It is understood that the device shown in FIG. 17 may undergo further CMOS processes to form various features such as contacts/vias, interconnect metal layers, dielectric layers, passivation layers, etc.

It will be understood that not all advantages have been necessarily discussed herein, no particular advantage is required for all embodiments or examples, and other embodiments or examples may offer different advantages.

With the foregoing structures of the recess in the isolation insulating layer and the gate electrode materials filled in the recess, it is possible to enlarge a surface area of the channel layer of the fin structure to be covered by the gate electrode. With the foregoing structures of the recess in the isolation insulating layer below the level of the interface between the isolation insulating layer and the interlayer dielectric layer and the gate electrode materials filled in the recess, it is possible to enlarge a surface area of the channel layer of the fin structure(s) to be covered by the gate electrode(s). The surface area can be vertically and/or horizontally enlarged, thereby performance of the Fin FET can be improved.

In accordance with one aspect of the present disclosure, a semiconductor device includes a first Fin FET device. The Fin FET device includes a fin structure extending in a first direction and extending from an isolation insulating layer. The Fin FET device also includes a gate stack including a gate electrode layer, a gate dielectric layer, side wall insulating layers disposed at both vertical sides of the gate electrode layer, and interlayer dielectric layers disposed at both vertical sides of the side wall insulating layers. The gate stack is disposed over the isolation insulating layer, covers a portion of the fin structure, and extends in a second direction perpendicular to the first direction. A recess is formed in an upper surface of the isolation insulating layer not covered by the side wall insulating layers and the interlayer dielectric layers. At least part of the gate electrode layer and the gate dielectric layer fill the recess.

In accordance with another aspect of the present disclosure, a semiconductor device includes a Fin FET device. The Fin FET device includes a first fin structure, a first gate stack, a second fin structure, a second gate stack and a separation plug separating the first gate stack and the second gate stack. The first fin structure extends in a first direction and extends from an isolation insulating layer. The first gate stack includes a first gate electrode layer, a first gate dielectric layer, first side wall insulating layers disposed at both vertical sides of the first gate electrode layer, and first interlayer dielectric layers disposed at both vertical sides of the first side wall insulating layers. The first gate stack is disposed over the isolation insulating layer, covers a portion of the first fin structure, and extends in a second direction perpendicular to the first direction. The second fin structure extends in the first direction and extends from the isolation insulating layer. The second gate stack includes a second gate electrode layer, a second gate dielectric layer, second side wall insulating layers disposed at both vertical sides of the second gate electrode layer, and second interlayer dielectric layers disposed at both vertical sides of the second side wall insulating layers. The second gate stack is disposed over the isolation insulating layer, covers a portion of the second fin structure, and extends in the second direction substantially perpendicular to the first direction. A first recess is formed in an upper surface of the isolation insulating layer not covered by the first and second side wall insulating layers and the first and second interlayer dielectric layers. A second recess is formed in the upper surface of the isolation insulating layer not covered by the first and second side wall insulating layers and the first and second interlayer dielectric layers. At least part of the first gate electrode layer and the first gate dielectric layer fill the first recess, and at least part of the second gate electrode layer and the second gate dielectric layer fill the second recess.

In accordance with another aspect of the present disclosure, a semiconductor device includes a Fin FET device. The Fin FET device includes a fin structure extending in a first direction and extending from an isolation insulating layer. The Fin FET device also includes an interlayer dielectric layer disposed over the isolation insulating layer. The Fin FET device includes a gate stack including a gate electrode layer and a gate dielectric layer. The gate stack is disposed over the isolation insulating layer, covers a portion of the fin structure, and extends in a second direction substantially perpendicular to the first direction. The Fin FET device further includes a side wall insulating layer disposed on an inner wall of a space formed in the isolation insulating layer.

The gate stack is disposed in the space. A bottom of the space is located below a bottom of the interlayer dielectric layer.

According to another embodiment of a semiconductor structure and methods for forming the semiconductor structures, the semiconductor structure includes a fin structure and an isolation insulating layer formed around the fin structure. A gate structure is formed across the fin structure and extends over the isolation insulating layer. In addition, the gate structure includes an extending portion extending into the isolation insulating layer, such that an effective area of the structure is increased. Accordingly, the electrical properties of semiconductor structure can be adjusted by the extending portion of the gate structure, and the performance and uniformity of the semiconductor structure can be improved.

In some embodiments, a semiconductor structure is provided. The semiconductor structure includes a substrate and a fin structure formed over the substrate. The semiconductor structure further includes an isolation insulating layer formed around the fin structure and a gate structure formed across the fin structure. In addition, the gate structure includes a first portion formed over the fin structure and a second portion formed over the isolation insulating layer, and the second portion of the gate structure includes an extending portion extending into the isolation insulating layer.

The extending portion of the second portion of the gate structure may have a thickness in a range from about 1 nm to about 200 nm. The semiconductor structure may further include a spacer formed on a sidewall of the second portion of the gate structure. The spacer does not extend into the isolation insulating layer. In some embodiments, a bottom surface of the spacer is not level with a bottom surface of the second portion of the gate structure over the isolation insulating layer. The spacer may have a first height, and the second portion of the gate structure has a second height which is greater than the first height. A dielectric layer is formed below the spacer and is in direct contact with the gate structure. The first portion of the gate structure may have a first width, and the extending portion of the second portion of the gate structure may have a second width which is greater than the first width. A difference between the first width and the second width is in a range from about 0.5 nm to about 20 nm. The gate structure may have a bottom surface that is substantially level with or lower than a bottom surface of the fin structure.

In some embodiments, a semiconductor structure is provided. The semiconductor structure includes a substrate and a fin structure formed over the substrate. The semiconductor structure further includes an isolation insulating layer formed around the fin structure and a gate structure formed across the fin structure and extending over the isolation insulating layer. The semiconductor structure further includes a spacer formed on a sidewall of the gate structure. In addition, a portion of the spacer formed on the sidewall of the gate structure over the isolation insulating layer has a first height, and a portion of the gate structure formed over the isolation insulating layer has a second height which is greater than the first height.

A difference between the first height and the second height may be in a range from about 1 nm to about 200 nm. A dielectric layer may be formed below the spacer and is in direct contact with the gate structure. The portion of the gate structure formed over the shallow trench may include an extending portion extending into the isolation insulating layer. The extending portion may further extend to a position below the spacer, such that a portion of the extending portion of the gate structure is overlapped with the spacer.

In some embodiments, a method for manufacturing a semiconductor structure is provided. The method for manufacturing a semiconductor structure includes forming a fin structure over a substrate and forming an isolation insulating layer around the fin structure over the substrate. The method for manufacturing a semiconductor structure further includes forming a dummy gate structure across the fin structure. The method for manufacturing a semiconductor structure further includes forming spacers on sidewalls of the dummy gate structure. The method for manufacturing a semiconductor structure further includes removing the dummy gate structure to form a trench between the spacers. The method for manufacturing a semiconductor structure further includes removing a portion of the isolation insulating layer to form an extended trench extending into the isolation insulating layer and forming a gate structure in the extended trench, wherein a portion of the gate structure extends into the isolation insulating layer.

The spacer positioned over the isolation insulating layer may have a first height and the gate structure positioned over the isolation insulating layer may have a second height which is greater than the first height. In some embodiments, a dielectric layer may be formed before the dummy gate structure and the spacers are formed, such that the dummy gate structure is formed on a first portion of the dielectric layer and the spacers are formed on a second portion of the dielectric layer. Further, the first portion of the dielectric layer may be removed after the dummy gate structure is removed. The second portion of the dielectric layer may be in direct contact with the gate structure. Further, in some embodiments, a portion of the second portion may be removed after the dummy gate structure is removed. A portion of the extended trench may further extend to a position below the spacers. In forming a gate structure in the trench, a gate dielectric layer may be formed over a bottom surface and sidewalls of the trench, a work function metal layer may be formed over the gate dielectric layer, and a metal gate electrode layer may be formed over the work function metal layer.

In another embodiment, a semiconductor device manufactured by the operations as set forth above includes a Fin FET device. The Fin FET device includes a fin structure extending in a first direction and extending from an isolation insulating layer; an interlayer dielectric layer disposed over the isolation insulating layer; and a gate stack including a gate electrode layer and a gate dielectric layer. The gate stack is disposed over the isolation insulating layer and covering a portion of the fin structure. The gate stack extends in a second direction perpendicular to the first direction. The Fin FET device further includes a side wall insulating layer disposed on an inner wall of a space formed in the isolation insulating layer. The gate stack is disposed in the space. A bottom of the space is located below a bottom of the interlayer dielectric layer. In a cross section along the first direction, a vertical interface between the material constituting the gate stack and the isolation insulating layer under the side wall insulating layer has a curved shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a Fin FET device including:
        a fin structure protruding from an isolation insulating layer; and
        a gate stack disposed over the fin structure and including a gate electrode layer, a gate dielectric layer, sidewall insulating layers disposed at both vertical sides of the gate electrode layer, wherein:
    a recess is formed in an upper surface of the isolation insulating layer not covered by the sidewall insulating layers,
    at least part of the gate electrode layer and the gate dielectric layer fill the recess,
    lateral ends of the recess penetrate under the sidewall insulating layers, respectively, and are located just below the sidewall insulating layers, respectively,
    a dielectric layer is disposed between the isolation insulating layer and at least one of the sidewall insulating layers,
    the gate dielectric layer is in direct contact with the dielectric layer and the at least one of the sidewall insulating layers,
    the gate electrode includes more than one conductive layer, and at least one of the more than one conductive layer exists under the sidewall insulating layers, and
    the gate dielectric layer includes a high-k dielectric material, and the high-k dielectric material exists under the sidewall insulating layers.

2. The semiconductor device of claim 1, wherein the dielectric layer is made of a different material than the sidewall insulating layers.

3. The semiconductor device of claim 1, wherein the recess has a curved profile in a cross section along a first direction in which the fin structure extends.

4. The semiconductor device of claim 3, wherein a width of an upper portion of the recess along the first direction is largest.

5. The semiconductor device of claim 3, wherein a width of a middle portion of the recess along the first direction is largest.

6. The semiconductor device of claim 3, wherein a width of a lower portion of the recess along the first direction is largest.

7. The semiconductor device of claim 1, wherein a depth of the recess from a level of an interface between the isolation insulating layer and the sidewall insulating layers is in a range of 1 nm to 200 nm.

8. A method for manufacturing a semiconductor device, comprising:
    forming a fin structure over a substrate such that the fin structure protrudes from an isolation insulating layer;
    forming a dummy gate structure over the fin structure, the dummy gate structure including a dummy gate dielectric layer and a dummy gate electrode layer;
    forming sidewall insulating layers at opposing vertical sides of the dummy gate electrode layer;
    forming interlayer dielectric layers disposed at both vertical sides of the sidewall insulating layers;
    removing the dummy electrode layer so that a space is created;
    etching a surface of the isolation insulating layer in the space so as to form a recess which penetrates under the sidewall insulating layers; and
    forming a gate structure including a gate electrode layer and a gate dielectric layer in the space and the recess, wherein:
    after the gate structure is formed, a part of the dummy gate dielectric layer remains between the isolation insulating layer and at least one of the sidewall insulating layers,
    the gate dielectric layer is in direct contact with the part of the dummy gate dielectric layer and the at least one of the sidewall insulating layers, and
    a difference between a width of the recess along the first direction and a width of the dummy electrode layer is less than twice a thickness of one of the sidewall insulating layers.

9. The method of claim 8, wherein a depth of the recess from a level of an interface between the isolation insulating layer and the sidewall insulating layers or an interface between the isolation insulating layer and the interlayer dielectric layers is in a range of 1 nm to 200 nm.

10. The method of claim 8, wherein a width of the recess along the first direction is largest at a middle portion of the recess.

11. The method of claim 8, wherein the sidewall insulating layers include more than one layers made of different materials.

12. The method of claim 8, wherein the recess is formed such that the recess has a curved profile in a cross section along a first direction in which the fin structure extends.

13. The method of claim 12, wherein a width of an upper portion of the recess along the first direction is largest.

14. The method of claim 12, wherein a width of a middle portion of the recess along the first direction is largest.

15. The method of claim 12, wherein a width of a lower portion of the recess along the first direction is largest.

16. A method of manufacturing a semiconductor device, comprising:
    forming a first fin structure and a second fin structure such that the first and second fin structure protrude from an isolation insulating layer;
    forming a dummy gate structure over the first fin structure and the second fin structure, the dummy gate structure including a dummy gate electrode layer and a dummy gate dielectric layer;
    forming sidewall insulating layers on opposing side faces of the dummy gate electrode layer;
    forming an interlayer dielectric layer;
    separating the dummy gate into a first part and a second part;
    forming a separation plug between the first part and second part;
    removing the dummy electrode layer from the first part and the second part so that a first space and a second space are created;
    etching the isolation insulating layer in the first space so as to form a first recess which penetrates under the sidewall insulating layers at the first part, and the isolation insulating layer in the second space so as to form a second recess which penetrates under the sidewall insulating layers at the second part;
    forming a first gate structure including a first gate electrode layer and a first gate dielectric layer in the first space and the first recess, and a second gate structure including a second gate electrode layer and a second gate dielectric layer in the second space and the second recess, wherein:

after the first and second gate structures are formed, a part of the dummy gate dielectric layer remains between the isolation insulating layer and the sidewall insulating layers, the first gate dielectric layer is in direct contact with the part of the dummy gate dielectric layer and the at least one of the sidewall insulating layers, and the second gate dielectric layer is in direct contact with the part of the dummy gate dielectric layer and the at least one of the sidewall insulating layers, and a difference between a width of the first and second recesses along the first direction and a width of the dummy electrode layer is less than twice a thickness of one of the sidewall insulating layers.

17. The method of claim 16, wherein a depth of the first and second recesses from a level of an interface between the isolation insulating layer and the sidewall insulating layers is in a range of 1 nm to 200 nm.

* * * * *